United States Patent
Cadugan et al.

(10) Patent No.: US 10,955,306 B2
(45) Date of Patent: Mar. 23, 2021

(54) COIL ACTUATED PRESSURE SENSOR AND DEFORMABLE SUBSTRATE

(71) Applicant: Allegro MicroSystems, LLC, Manchester, NH (US)

(72) Inventors: Bryan Cadugan, Bedford, NH (US); Jason Boudreau, Exeter, NH (US); William P. Taylor, Amherst, NH (US)

(73) Assignee: Allegro MicroSystems, LLC, Manchester, NH (US)

(*) Notice: Subject to any disclaimer, the term of this patent is extended or adjusted under 35 U.S.C. 154(b) by 114 days.

(21) Appl. No.: 16/390,355

(22) Filed: Apr. 22, 2019

(65) Prior Publication Data
US 2020/0333203 A1 Oct. 22, 2020

(51) Int. Cl.
*G01B 7/14* (2006.01)
*G01L 9/10* (2006.01)
(Continued)

(52) U.S. Cl.
CPC .............. *G01L 9/10* (2013.01); *G01L 9/0004* (2013.01); *G01R 33/07* (2013.01); *G01R 33/09* (2013.01)

(58) Field of Classification Search
CPC . G01L 9/10; G01L 9/12; G01L 9/0073; G01L 9/0004; G01L 19/04;
(Continued)

(56) References Cited

U.S. PATENT DOCUMENTS 3,132,337 A   5/1964  Martin
3,195,043 A   7/1965  Burig et al.
(Continued)

FOREIGN PATENT DOCUMENTS

CH   683 469 A5   3/1994
DE   25 18 054    11/1976
(Continued)

OTHER PUBLICATIONS

International Preliminary Report on Patentability dated Dec. 5, 2019 for PCT Application PCT/US2018/028476; 8 pages.
(Continued)

*Primary Examiner* — Thang X Le
(74) *Attorney, Agent, or Firm* — Daly, Crowley, Mofford & Durkee, LLP

(57) ABSTRACT

A pressure sensor comprises a deformable substrate, at least one coil supported by the substrate and responsive to a changing coil drive signal to produce a changing magnetic field, a fluid chamber having a first wall formed by the substrate and a second wall formed by a conductive material and positioned proximate to the at least one coil so that the changing magnetic field produces eddy currents within the conductive material that generate a reflected magnetic field, and at least one magnetic field sensing element configured to detect the reflected magnetic field and produce a signal responsive to a distance between the magnetic field sensing element and the second wall. The substrate is deformable by fluid pressure within the fluid chamber and the deformation of the substrate changes the distance between the magnetic field sensing element and the second wall.

27 Claims, 7 Drawing Sheets

(51) Int. Cl.
  *G01L 9/00* (2006.01)
  *G01R 33/09* (2006.01)
  *G01R 33/07* (2006.01)

(58) Field of Classification Search
  CPC . G01L 19/0084; G01L 19/145; G01L 19/146; G01L 7/022; G01L 7/0024; G01L 7/0054; G01R 33/07; G01R 33/09
  See application file for complete search history.

(56) References Cited

U.S. PATENT DOCUMENTS

| | | |
|---|---|---|
| 3,281,628 A | 10/1966 | Bauer et al. |
| 3,607,528 A | 9/1971 | Gassaway |
| 3,611,138 A | 10/1971 | Winebrener |
| 3,661,061 A | 5/1972 | Tokarz |
| 3,728,786 A | 4/1973 | Lucas et al. |
| 4,048,670 A | 9/1977 | Eysermans |
| 4,188,605 A | 2/1980 | Stout |
| 4,204,317 A | 5/1980 | Winn |
| 4,236,832 A | 12/1980 | Komatsu et al. |
| 4,283,643 A | 8/1981 | Levin |
| 4,315,523 A | 2/1982 | Mahawili et al. |
| 4,438,347 A | 3/1984 | Gehring |
| 4,573,258 A | 3/1986 | Io et al. |
| 4,614,111 A | 9/1986 | Wolff |
| 4,649,796 A | 3/1987 | Schmidt |
| 4,670,715 A | 6/1987 | Fuzzell |
| 4,703,378 A | 10/1987 | Imakoshi et al. |
| 4,719,419 A | 1/1988 | Dawley |
| 4,733,455 A | 3/1988 | Nakamura et al. |
| 4,745,363 A | 5/1988 | Carr et al. |
| 4,746,859 A | 5/1988 | Malik |
| 4,752,733 A | 6/1988 | Petr et al. |
| 4,758,943 A | 7/1988 | Aström et al. |
| 4,760,285 A | 7/1988 | Nelson |
| 4,764,767 A | 8/1988 | Ichikawa et al. |
| 4,769,344 A | 9/1988 | Sakai et al. |
| 4,772,929 A | 9/1988 | Manchester |
| 4,789,826 A | 12/1988 | Willett |
| 4,796,354 A | 1/1989 | Yokoyama et al. |
| 4,823,075 A | 4/1989 | Alley |
| 4,833,406 A | 5/1989 | Foster |
| 4,893,027 A | 1/1990 | Kammerer et al. |
| 4,908,685 A | 3/1990 | Shibasaki et al. |
| 4,910,861 A | 3/1990 | Dohogne |
| 4,935,698 A | 6/1990 | Kawaji et al. |
| 4,944,028 A | 7/1990 | Iijima et al. |
| 4,954,777 A | 9/1990 | Klopfer et al. |
| 4,970,411 A | 11/1990 | Hälg et al. |
| 4,983,916 A | 1/1991 | Iijima et al. |
| 5,012,322 A | 4/1991 | Guillotte et al. |
| 5,021,493 A | 6/1991 | Sandstrom |
| 5,028,868 A | 7/1991 | Murata et al. |
| 5,045,920 A | 9/1991 | Vig et al. |
| 5,078,944 A | 1/1992 | Yoshino |
| 5,084,289 A | 1/1992 | Shin et al. |
| 5,121,289 A | 6/1992 | Gagliardi |
| 5,137,677 A | 8/1992 | Murata |
| 5,139,973 A | 8/1992 | Nagy et al. |
| 5,167,896 A | 12/1992 | Hirota et al. |
| 5,185,919 A | 2/1993 | Hickey |
| 5,196,794 A | 3/1993 | Murata |
| 5,200,698 A | 4/1993 | Thibaud |
| 5,210,493 A | 5/1993 | Schroeder et al. |
| 5,216,405 A | 6/1993 | Schroeder et al. |
| 5,244,834 A | 9/1993 | Suzuki et al. |
| 5,247,202 A | 9/1993 | Popovic et al. |
| 5,247,278 A | 9/1993 | Pant et al. |
| 5,250,925 A | 10/1993 | Shinkle |
| 5,286,426 A | 2/1994 | Rano, Jr. et al. |
| 5,289,344 A | 2/1994 | Gagnon et al. |
| 5,315,245 A | 5/1994 | Schroeder et al. |
| 5,329,416 A | 7/1994 | Ushiyama et al. |
| 5,332,956 A | 7/1994 | Oh |
| 5,332,965 A | 7/1994 | Wolf et al. |
| 5,399,968 A | 3/1995 | Sheppard et al. |
| 5,412,255 A | 5/1995 | Wallrafen |
| 5,414,355 A | 5/1995 | Davidson et al. |
| 5,424,558 A | 6/1995 | Borden et al. |
| 5,432,444 A | 7/1995 | Yasohama et al. |
| 5,434,105 A | 7/1995 | Liou |
| 5,453,727 A | 9/1995 | Shibasaki et al. |
| 5,469,058 A | 11/1995 | Dunnam |
| 5,479,695 A | 1/1996 | Grader et al. |
| 5,486,759 A | 1/1996 | Seiler et al. |
| 5,488,294 A | 1/1996 | Liddell et al. |
| 5,491,633 A | 2/1996 | Henry et al. |
| 5,497,081 A | 3/1996 | Wolf et al. |
| 5,500,589 A | 3/1996 | Sumcad |
| 5,500,994 A | 3/1996 | Itaya |
| 5,508,611 A | 4/1996 | Schroeder et al. |
| 5,521,501 A | 5/1996 | Dettmann et al. |
| 5,545,983 A | 8/1996 | Okeya et al. |
| 5,551,146 A | 9/1996 | Kawabata et al. |
| 5,581,170 A | 12/1996 | Mammano et al. |
| 5,581,179 A | 12/1996 | Engel et al. |
| 5,596,272 A | 1/1997 | Busch |
| 5,621,319 A | 4/1997 | Bilotti et al. |
| 5,627,315 A | 5/1997 | Figi et al. |
| 5,631,557 A | 5/1997 | Davidson |
| 5,640,090 A | 6/1997 | Furuya et al. |
| 5,691,637 A | 11/1997 | Oswald et al. |
| 5,696,790 A | 12/1997 | Graham et al. |
| 5,712,562 A | 1/1998 | Berg |
| 5,714,102 A | 2/1998 | Highum et al. |
| 5,719,496 A | 2/1998 | Wolf |
| 5,729,128 A | 3/1998 | Bunyer et al. |
| 5,757,181 A | 5/1998 | Wolf et al. |
| 5,781,005 A | 7/1998 | Vig et al. |
| 5,789,658 A | 8/1998 | Henn et al. |
| 5,789,915 A | 8/1998 | Ingraham |
| 5,796,249 A | 8/1998 | Andräet et al. |
| 5,798,462 A | 8/1998 | Briefer et al. |
| 5,818,222 A | 10/1998 | Ramsden |
| 5,818,223 A | 10/1998 | Wolf |
| 5,839,185 A | 11/1998 | Smith et al. |
| 5,841,276 A | 11/1998 | Makino et al. |
| 5,859,387 A | 1/1999 | Gagnon |
| 5,883,567 A | 3/1999 | Mullins, Jr. |
| 5,886,070 A | 3/1999 | Honkura et al. |
| 5,896,030 A | 4/1999 | Hasken |
| 5,912,556 A | 6/1999 | Frazee et al. |
| 5,963,028 A | 10/1999 | Engel et al. |
| 6,011,770 A | 1/2000 | Tan |
| 6,016,055 A | 1/2000 | Jäger et al. |
| 6,043,644 A | 3/2000 | de Coulon et al. |
| 6,043,646 A | 3/2000 | Jansseune |
| 6,064,198 A | 5/2000 | Wolf et al. |
| 6,136,250 A | 10/2000 | Brown |
| 6,169,396 B1 | 1/2001 | Yokotani et al. |
| 6,175,233 B1 | 1/2001 | McCurley et al. |
| 6,180,041 B1 | 1/2001 | Takizawa |
| 6,184,679 B1 | 2/2001 | Popovic et al. |
| 6,198,373 B1 | 3/2001 | Ogawa et al. |
| 6,242,604 B1 | 6/2001 | Hudlicky et al. |
| 6,242,904 B1 | 6/2001 | Shirai et al. |
| 6,242,905 B1 | 6/2001 | Draxelmayr |
| 6,265,865 B1 | 7/2001 | Engel et al. |
| 6,278,269 B1 | 8/2001 | Vig et al. |
| 6,297,627 B1 | 10/2001 | Towne et al. |
| 6,339,322 B1 | 1/2002 | Loreck et al. |
| 6,351,506 B1 | 2/2002 | Lewicki |
| 6,356,068 B1 | 3/2002 | Steiner et al. |
| 6,392,478 B1 | 5/2002 | Mulder et al. |
| 6,429,640 B1 | 8/2002 | Daughton et al. |
| 6,436,748 B1 | 8/2002 | Forbes et al. |
| 6,437,558 B2 | 8/2002 | Li et al. |
| 6,452,381 B1 | 9/2002 | Nakatani et al. |
| 6,462,536 B1 | 10/2002 | Mednikov et al. |
| 6,492,804 B2 | 12/2002 | Tsuge et al. |
| 6,501,270 B1 | 12/2002 | Opie |
| 6,504,363 B1 | 1/2003 | Dogaru et al. |
| 6,525,531 B2 | 2/2003 | Forrest et al. |

(56) References Cited

U.S. PATENT DOCUMENTS

| | | |
|---|---|---|
| 6,528,992 B2 | 3/2003 | Shinjo et al. |
| 6,542,847 B1 | 4/2003 | Lohberg et al. |
| 6,545,332 B2 | 4/2003 | Huang |
| 6,545,457 B2 | 4/2003 | Goto et al. |
| 6,545,462 B2 | 4/2003 | Schott et al. |
| 6,566,872 B1 | 5/2003 | Sugitani |
| 6,640,451 B1 | 11/2003 | Vinarcik |
| 6,653,968 B1 | 11/2003 | Schneider |
| 6,674,679 B1 | 1/2004 | Perner et al. |
| 6,687,644 B1 | 2/2004 | Zinke et al. |
| 6,692,676 B1 | 2/2004 | Vig et al. |
| 6,704,186 B2 * | 3/2004 | Ishikura ............... G01D 5/2417 361/283.1 |
| 6,707,298 B2 | 3/2004 | Suzuki et al. |
| 6,759,843 B2 | 7/2004 | Furlong |
| 6,770,163 B1 | 8/2004 | Kuah et al. |
| 6,781,233 B2 | 8/2004 | Zverev et al. |
| 6,781,359 B2 | 8/2004 | Stauth et al. |
| 6,798,193 B2 | 9/2004 | Zimmerman et al. |
| 6,815,944 B2 | 11/2004 | Vig et al. |
| 6,822,443 B1 | 11/2004 | Dogaru |
| 6,853,178 B2 | 2/2005 | Hayat-Dawoodi |
| 6,896,407 B2 | 5/2005 | Nomiyama et al. |
| 6,902,951 B2 | 6/2005 | Goller et al. |
| 6,917,321 B1 | 7/2005 | Haurie et al. |
| 6,956,366 B2 | 10/2005 | Butzmann |
| 7,023,205 B1 | 4/2006 | Krupp |
| 7,026,808 B2 | 4/2006 | Vig et al. |
| 7,031,170 B2 | 4/2006 | Daeche et al. |
| 7,038,448 B2 | 5/2006 | Schott et al. |
| 7,049,924 B2 | 5/2006 | Hayashi et al. |
| 7,112,955 B2 | 9/2006 | Buchhold |
| 7,112,957 B2 | 9/2006 | Bicking |
| 7,126,327 B1 | 10/2006 | Busch |
| 7,132,825 B2 | 11/2006 | Martin |
| 7,190,784 B2 | 3/2007 | Li |
| 7,193,412 B2 | 3/2007 | Freeman |
| 7,199,579 B2 | 4/2007 | Scheller et al. |
| 7,259,545 B2 | 8/2007 | Stauth et al. |
| 7,265,531 B2 | 9/2007 | Stauth et al. |
| 7,269,992 B2 | 9/2007 | Lamb et al. |
| 7,285,952 B1 | 10/2007 | Hatanaka et al. |
| 7,292,095 B2 | 11/2007 | Burt et al. |
| 7,295,000 B2 | 11/2007 | Werth |
| 7,319,319 B2 | 1/2008 | Jones et al. |
| 7,323,780 B2 | 1/2008 | Daubenspeck et al. |
| 7,323,870 B2 | 1/2008 | Tatschl et al. |
| 7,325,175 B2 | 1/2008 | Momtaz |
| 7,345,468 B2 | 3/2008 | Okada et al. |
| 7,355,388 B2 | 4/2008 | Ishio |
| 7,361,531 B2 | 4/2008 | Sharma et al. |
| 7,362,094 B2 | 4/2008 | Voisine et al. |
| 7,365,530 B2 | 4/2008 | Bailey et al. |
| 7,385,394 B2 | 6/2008 | Auburger et al. |
| 7,425,821 B2 | 9/2008 | Monreal et al. |
| 7,474,093 B2 | 1/2009 | Ausserlechner |
| 7,476,953 B2 | 1/2009 | Taylor et al. |
| 7,518,354 B2 | 4/2009 | Stauth et al. |
| 7,592,801 B2 | 9/2009 | Bailey et al. |
| 7,598,601 B2 | 10/2009 | Taylor et al. |
| 7,605,647 B1 | 10/2009 | Romero et al. |
| 7,635,993 B2 | 12/2009 | Boeve |
| 7,694,200 B2 | 4/2010 | Forrest et al. |
| 7,701,208 B2 | 4/2010 | Nishikawa |
| 7,705,586 B2 | 4/2010 | van Zon et al. |
| 7,729,675 B2 | 6/2010 | Krone |
| 7,746,056 B2 | 6/2010 | Stauth et al. |
| 7,746,065 B2 | 6/2010 | Pastre et al. |
| 7,764,118 B2 | 7/2010 | Kusuda et al. |
| 7,768,083 B2 | 8/2010 | Doogue et al. |
| 7,769,110 B2 | 8/2010 | Momtaz |
| 7,800,389 B2 | 9/2010 | Friedrich et al. |
| 7,808,074 B2 | 10/2010 | Knittl |
| 7,816,772 B2 | 10/2010 | Engel et al. |
| 7,816,905 B2 | 10/2010 | Doogue et al. |
| 7,839,141 B2 | 11/2010 | Werth et al. |
| 7,886,610 B2 | 2/2011 | Gustafson et al. |
| 7,923,996 B2 | 4/2011 | Doogue et al. |
| 7,936,144 B2 | 5/2011 | Vig et al. |
| 7,956,604 B2 | 6/2011 | Ausserlechner |
| 7,961,823 B2 | 6/2011 | Kolze et al. |
| 7,982,454 B2 | 7/2011 | Fernandez et al. |
| 7,990,209 B2 | 8/2011 | Romero |
| 8,030,918 B2 | 10/2011 | Doogue et al. |
| 8,058,870 B2 | 11/2011 | Sterling |
| 8,063,631 B2 | 11/2011 | Fermon et al. |
| 8,063,634 B2 | 11/2011 | Sauber et al. |
| 8,080,993 B2 | 12/2011 | Theuss et al. |
| 8,106,654 B2 | 1/2012 | Theuss et al. |
| 8,128,549 B2 | 3/2012 | Testani et al. |
| 8,134,358 B2 | 3/2012 | Charlier et al. |
| 8,143,169 B2 | 3/2012 | Engel et al. |
| 8,253,210 B2 | 8/2012 | Theuss et al. |
| 8,274,279 B2 | 9/2012 | Gies |
| 8,299,783 B2 | 10/2012 | Fernandez et al. |
| 8,362,579 B2 | 1/2013 | Theuss et al. |
| 8,447,556 B2 | 5/2013 | Friedrich et al. |
| 8,461,677 B2 | 6/2013 | Ararao et al. |
| 8,486,755 B2 | 7/2013 | Ararao et al. |
| 8,542,010 B2 | 9/2013 | Cesaretti et al. |
| 8,577,634 B2 | 11/2013 | Donovan et al. |
| 8,610,430 B2 | 12/2013 | Werth et al. |
| 8,624,588 B2 | 1/2014 | Vig et al. |
| 8,629,520 B2 | 1/2014 | Doogue et al. |
| 8,629,539 B2 | 1/2014 | Milano et al. |
| 8,680,846 B2 | 3/2014 | Cesaretti et al. |
| 8,680,848 B2 | 3/2014 | Foletto et al. |
| 8,754,640 B2 | 6/2014 | Vig et al. |
| 8,773,124 B2 | 7/2014 | Ausserlechner |
| 9,081,041 B2 | 7/2015 | Friedrich et al. |
| 9,116,018 B2 | 8/2015 | Frachon |
| 9,164,156 B2 | 10/2015 | Elian et al. |
| 9,201,122 B2 | 12/2015 | Cesaretti et al. |
| 9,201,123 B2 | 12/2015 | Elian et al. |
| 9,228,860 B2 | 1/2016 | Sharma et al. |
| 9,411,025 B2 | 8/2016 | David et al. |
| 9,664,494 B2 | 5/2017 | Fernandez et al. |
| 9,797,759 B2 * | 10/2017 | Lozano ............... G01K 1/00 |
| 9,810,519 B2 | 11/2017 | Taylor et al. |
| 9,812,588 B2 | 11/2017 | Vig et al. |
| 9,817,078 B2 | 11/2017 | Pepka et al. |
| 9,823,092 B2 | 11/2017 | David et al. |
| 9,857,259 B2 | 1/2018 | Broden et al. |
| 10,145,908 B2 | 12/2018 | David et al. |
| 10,234,513 B2 | 3/2019 | Vig et al. |
| 10,310,028 B2 | 6/2019 | Latham et al. |
| 10,324,141 B2 | 6/2019 | Latham et al. |
| 2001/0002791 A1 | 6/2001 | Tsuge et al. |
| 2001/0009367 A1 | 7/2001 | Seitzer et al. |
| 2002/0027488 A1 | 3/2002 | Hayat-Dawoodi et al. |
| 2002/0084923 A1 | 7/2002 | Li |
| 2003/0001563 A1 | 1/2003 | Turner |
| 2003/0038675 A1 | 2/2003 | Gailus et al. |
| 2003/0062891 A1 | 4/2003 | Slates |
| 2003/0102909 A1 | 6/2003 | Motz |
| 2003/0222642 A1 | 12/2003 | Butzmann |
| 2003/0227286 A1 | 12/2003 | Dunisch et al. |
| 2004/0032251 A1 | 2/2004 | Zimmerman et al. |
| 2004/0046248 A1 | 3/2004 | Waelti et al. |
| 2004/0062362 A1 | 4/2004 | Matsuya |
| 2004/0080314 A1 | 4/2004 | Tsujii et al. |
| 2004/0135220 A1 | 7/2004 | Goto |
| 2004/0174164 A1 | 9/2004 | Ao |
| 2004/0184196 A1 | 9/2004 | Jayasekara |
| 2004/0196045 A1 | 10/2004 | Larsen |
| 2005/0017709 A1 | 1/2005 | Stolfus et al. |
| 2005/0120782 A1 | 6/2005 | Kishibata et al. |
| 2005/0122095 A1 | 6/2005 | Dooley |
| 2005/0122099 A1 | 6/2005 | Imamoto et al. |
| 2005/0167790 A1 | 8/2005 | Khor et al. |
| 2005/0179429 A1 | 8/2005 | Lohberg |
| 2005/0225318 A1 | 10/2005 | Bailey et al. |
| 2005/0280411 A1 | 12/2005 | Bicking |
| 2006/0033487 A1 | 2/2006 | Nagano et al. |

(56) References Cited

U.S. PATENT DOCUMENTS

| | | |
|---|---|---|
| 2006/0038559 A1 | 2/2006 | Lamb et al. |
| 2006/0068237 A1 | 3/2006 | Murphy et al. |
| 2006/0097717 A1 | 5/2006 | Tokuhara et al. |
| 2006/0125473 A1 | 6/2006 | Frachon et al. |
| 2006/0181263 A1 | 8/2006 | Doogue et al. |
| 2006/0202692 A1 | 9/2006 | Tatschl et al. |
| 2006/0261801 A1 | 11/2006 | Busch |
| 2007/0025028 A1 | 2/2007 | Chung et al. |
| 2007/0110199 A1 | 5/2007 | Momtaz et al. |
| 2007/0170533 A1 | 7/2007 | Doogue et al. |
| 2007/0247141 A1 | 10/2007 | Pastre et al. |
| 2007/0285089 A1 | 12/2007 | Ibuki et al. |
| 2008/0013298 A1 | 1/2008 | Sharma et al. |
| 2008/0137784 A1 | 6/2008 | Krone |
| 2008/0237818 A1 | 10/2008 | Engel et al. |
| 2008/0238410 A1 | 10/2008 | Charlier et al. |
| 2008/0270067 A1 | 10/2008 | Eriksen et al. |
| 2009/0001964 A1 | 1/2009 | Strzalkowski |
| 2009/0009163 A1 | 1/2009 | Yamada |
| 2009/0058404 A1 | 3/2009 | Kurumado |
| 2009/0071258 A1* | 3/2009 | Kouda ............... A61M 1/3641 73/723 |
| 2009/0085706 A1 | 4/2009 | Baarman et al. |
| 2009/0102467 A1 | 4/2009 | Snell et al. |
| 2009/0140725 A1 | 6/2009 | Ausserlechner |
| 2009/0146647 A1 | 6/2009 | Ausserlechner |
| 2009/0152696 A1 | 6/2009 | Dimasacat et al. |
| 2009/0167298 A1 | 7/2009 | Kreutzbruck et al. |
| 2009/0168286 A1 | 7/2009 | Berkley et al. |
| 2009/0206831 A1 | 8/2009 | Fermon et al. |
| 2009/0243601 A1 | 10/2009 | Feldtkeller |
| 2009/0251134 A1 | 10/2009 | Uenoyama |
| 2009/0315543 A1 | 12/2009 | Guo et al. |
| 2010/0033175 A1 | 2/2010 | Boeve et al. |
| 2010/0052667 A1 | 3/2010 | Kohama et al. |
| 2010/0072988 A1 | 3/2010 | Hammerschmidt et al. |
| 2010/0188078 A1 | 7/2010 | Foletto et al. |
| 2010/0201356 A1 | 8/2010 | Koller et al. |
| 2010/0276769 A1 | 11/2010 | Theuss et al. |
| 2010/0295140 A1 | 11/2010 | Theuss et al. |
| 2011/0018533 A1 | 1/2011 | Cesaretti et al. |
| 2011/0031960 A1 | 2/2011 | Hohe et al. |
| 2011/0127998 A1 | 6/2011 | Elian et al. |
| 2011/0267040 A1 | 11/2011 | Frachon |
| 2011/0285384 A1 | 11/2011 | Nomura |
| 2012/0019236 A1 | 1/2012 | Tiernan et al. |
| 2012/0062215 A1 | 3/2012 | Ide et al. |
| 2013/0113474 A1 | 5/2013 | Elian |
| 2013/0147470 A1 | 6/2013 | Mulholland et al. |
| 2013/0214777 A1 | 8/2013 | Itoi |
| 2013/0241543 A1 | 9/2013 | Stenson et al. |
| 2013/0278246 A1 | 10/2013 | Stegerer et al. |
| 2013/0300401 A1 | 11/2013 | Krapf et al. |
| 2014/0150559 A1* | 6/2014 | Ishihara ............... G01L 19/147 73/718 |
| 2014/0175572 A1* | 6/2014 | Hsu ............... G01P 15/125 257/415 |
| 2014/0263287 A1 | 9/2014 | Widitora et al. |
| 2014/0327435 A1 | 11/2014 | Rohrer |
| 2014/0332232 A1* | 11/2014 | Hallandbæk ............ E21B 33/10 166/373 |
| 2015/0022197 A1 | 1/2015 | David et al. |
| 2016/0250444 A1 | 9/2016 | Lampropoulos et al. |
| 2018/0011150 A1 | 1/2018 | Pepka et al. |
| 2018/0340911 A1 | 11/2018 | Romero |
| 2018/0340986 A1 | 11/2018 | Latham et al. |
| 2018/0340988 A1 | 11/2018 | Latham et al. |
| 2018/0340989 A1 | 11/2018 | Latham et al. |

FOREIGN PATENT DOCUMENTS

| | | |
|---|---|---|
| DE | 40 31 560 A | 4/1992 |
| DE | 195 39 458 A1 | 4/1997 |
| DE | 196 34 715 A1 | 3/1998 |
| DE | 196 50 935 A1 | 6/1998 |
| DE | 198 38 433 A1 | 3/1999 |
| DE | 198 51 839 A1 | 11/1999 |
| DE | 199 61 504 A1 | 6/2001 |
| DE | 102 10 184 A1 | 9/2003 |
| DE | 103 14 602 A1 | 10/2004 |
| DE | 10 2006 037 226 A1 | 2/2008 |
| DE | 10 2007 018 238 A1 | 10/2008 |
| DE | 10 2007 041 230 B3 | 4/2009 |
| DE | 10 2010 016 584 A1 | 11/2010 |
| DE | 10 2011 102 483 A1 | 11/2012 |
| EP | 0 289 414 A2 | 11/1988 |
| EP | 0 289 414 A3 | 11/1988 |
| EP | 0 357 013 A2 | 3/1990 |
| EP | 0 357 013 A3 | 3/1990 |
| EP | 0 361 456 A2 | 4/1990 |
| EP | 0 361 456 A3 | 4/1990 |
| EP | 0629834 A1 | 12/1994 |
| EP | 0 680 103 A1 | 11/1995 |
| EP | 0 898 180 A2 | 2/1999 |
| EP | 0 944 888 B1 | 9/1999 |
| EP | 1 306 687 A2 | 5/2003 |
| EP | 1 443 332 A1 | 8/2004 |
| EP | 1 580 560 A1 | 9/2005 |
| EP | 1 637 898 A1 | 3/2006 |
| EP | 1 662 353 A1 | 5/2006 |
| EP | 1 679 524 A1 | 7/2006 |
| EP | 1 797 496 B1 | 6/2007 |
| EP | 1 850 143 A1 | 10/2007 |
| EP | 2 063 229 A1 | 5/2009 |
| EP | 1 797 496 | 7/2009 |
| EP | 2 402 719 A1 | 1/2012 |
| EP | 3 139 190 A1 | 8/2017 |
| FR | 2 748 105 A1 | 10/1997 |
| FR | 2 909 756 A1 | 6/2008 |
| GB | 2 135 060 A | 8/1984 |
| GB | 2 276 727 A | 10/1994 |
| GB | 2 481 482 A | 12/2011 |
| JP | S5771504 A | 5/1982 |
| JP | S60182503 A | 9/1985 |
| JP | 363 084176 A | 4/1988 |
| JP | 63-263782 A | 10/1988 |
| JP | 63-300911 | 12/1988 |
| JP | H02-116753 | 5/1990 |
| JP | H03-29817 | 2/1991 |
| JP | H03-35182 A | 2/1991 |
| JP | H04-095817 | 3/1992 |
| JP | H06-273437 | 9/1994 |
| JP | 08-197486 A | 4/1996 |
| JP | H08-511348 A | 11/1996 |
| JP | 09-166612 | 6/1997 |
| JP | 10-332725 | 12/1998 |
| JP | H10-318784 A | 12/1998 |
| JP | 11-064363 | 3/1999 |
| JP | 11-074142 | 3/1999 |
| JP | 2000-183241 | 6/2000 |
| JP | 2001-043475 A | 2/2001 |
| JP | 2001-141738 | 5/2001 |
| JP | 2001-165702 A | 6/2001 |
| JP | 2001-165951 | 6/2001 |
| JP | 2002-117500 A | 4/2002 |
| JP | 2002-149013 A | 5/2002 |
| JP | 2002-357920 A | 12/2002 |
| JP | 2003-177171 | 6/2003 |
| JP | 2003-202365 A | 7/2003 |
| JP | 2004-055932 A | 2/2004 |
| JP | 2004-093381 | 3/2004 |
| JP | 2004-152688 A | 5/2004 |
| JP | 2004-356338 A | 12/2004 |
| JP | 2004-357858 A | 12/2004 |
| JP | 2005-517928 A | 6/2005 |
| JP | 2005-337866 A | 12/2005 |
| JP | 2005-345302 A | 12/2005 |
| JP | 2006-003096 A | 1/2006 |
| JP | 2006-3116 A | 1/2006 |
| JP | 2006-275764 A | 10/2006 |
| JP | 2006-284466 A | 10/2006 |
| JP | 2007-012582 A | 1/2007 |
| JP | 2007-218799 A | 8/2007 |

(56) References Cited

FOREIGN PATENT DOCUMENTS

| | | |
|---|---|---|
| JP | 2008-180550 A | 8/2008 |
| JP | 2008-264569 A | 11/2008 |
| JP | 2009-222524 A | 10/2009 |
| JP | 2011/086479 A | 4/2011 |
| JP | 2012-501446 A | 1/2012 |
| JP | 61-48777 | 5/2017 |
| WO | WO 88/09026 | 11/1988 |
| WO | WO 1993/12403 | 6/1993 |
| WO | WO 1994/08203 | 4/1994 |
| WO | WO 94/29672 | 12/1994 |
| WO | WO 1999/18982 | 7/1995 |
| WO | WO 96/02849 A1 | 2/1996 |
| WO | WO 1999/49322 A1 | 9/1999 |
| WO | WO 2001/40790 A1 | 6/2001 |
| WO | WO 2001/74139 A2 | 10/2001 |
| WO | WO 2003/069358 A2 | 8/2003 |
| WO | WO 2003/107018 A1 | 12/2003 |
| WO | WO 2004/027436 A1 | 4/2004 |
| WO | WO 2004/072672 A1 | 8/2004 |
| WO | WO 2005/013363 A | 2/2005 |
| WO | WO 2006/035342 A1 | 4/2006 |
| WO | WO 2006/056829 A1 | 6/2006 |
| WO | WO 2006/083479 A1 | 8/2006 |
| WO | WO 2007/095971 A1 | 8/2007 |
| WO | WO 2007/138508 A1 | 12/2007 |
| WO | WO 2008/008140 A2 | 1/2008 |
| WO | WO 2008/008140 A3 | 1/2008 |
| WO | WO 2008/048379 A1 | 4/2008 |
| WO | WO 2008/121443 A1 | 10/2008 |
| WO | WO 2008/145662 A1 | 12/2008 |
| WO | WO 2009/108422 A2 | 9/2009 |
| WO | WO 2010/014309 A1 | 2/2010 |
| WO | WO 2010/027658 A2 | 3/2010 |
| WO | WO 2010/065315 A1 | 6/2010 |
| WO | WO 2010/096367 A1 | 8/2010 |
| WO | WO 2011/011479 A1 | 1/2011 |
| WO | WO 2012/148646 A1 | 11/2012 |
| WO | WO 2013/169455 A1 | 11/2013 |
| WO | WO 2014/105302 A1 | 7/2014 |
| WO | WO 2015/058733 A1 | 4/2015 |

OTHER PUBLICATIONS

Response to communication pursuant to Rules 161(1) and 162 EPC filed on Jul. 16, 2020 for European Application No. 18723195.6; 11 pages.
Communication pursuant to Rules 161(1) and 162 EPC dated Jan. 10, 2020 for European Application No. 18723195.6; 3 pages.
U.S. Appl. No. 16/295,131, filed Mar. 7, 2019, Cadugan, et al.
Ahn et al.; "A New Toroidal-Meander Type Integrated Inductor with a Multilevel Meander Magnetic Core;" IEEE Transaction on Magnetics; vol. 30; No. 1; Jan. 1, 1994; 7 pages.
Allegro "Two-Wire True Zero Speed Miniature Differential Peak-Detecting Gear Tooth Sensor;" ATS645LSH; 2004; Allegro MicroSystems, Inc., Manchester, NH, 03103; 14 pages.
Allegro Microsystems, Inc., "Gear-Tooth Sensor for Automotive Applications," Aug. 3, 2001; 2 pages.
Allegro MicroSystems, Inc., Hall-Effect IC Applications Guide, http://www.allegromicro.com/en/Products/Design/an/an27701.pdf, Copyright 1987, 1997; 36 pages.
Alllegro "True Zero-Speed Low-Jitter High Accuracy Gear Tooth Sensor;" ATS625LSG; 2005; Allegro MicroSystems, Inc. Manchester, NH 03103; 21 pages.
Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; 8 pages.
Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; 4 pages.
Ausserlechner; "Limits of Offset Cancellation by the Principle of Spinning Current Hall Probe;" Proceedings of IEEE Sensors; Oct. 2004; 4 pages.
Ausserlechner; "The piezo-Hall effect in n-silicon for arbitrary crystal orientation;" Proceedings of IEEE Sensors; vol. 3; Oct. 24, 2004; ISBN: 0-7803-8692-2; 4 pages.
Bahreyni, et al.; "A Resonant Micromachined Magnetic Field Sensor;" IEEE Sensors Journal; vol. 7, No. 9, Sep. 2007; 9 pages.
Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; 12 pages.
Baschirotto et al.; "Development and Analysis of PCB Vector 2-D Magnetic Field Sensor System for Electronic Compass;" IEEE Sensors Journal vol. 6, No. 2; Apr. 2006; 7 pages.
Bilotti et al.; "Monolithic Magnetic Hall Sensor Using Dynamic Quadrature Offset Cancellation;" IEEE Journal of Solid-State Circuits; vol. 32, Issue 6; Jun. 1997; 8 pages.
Bowers et al., "Microfabrication and Process Integration of Powder-Based Permanent Magnets", Interdisciplinary Microsystems Group, Dept. Electrical and Computer Engineering, University of Florida, USA; Technologies for Future Micro-Nano Manufacturing Workshop, Napa, California, Aug. 8-10, 2011; 4 pages.
Communication Pursuant to Rule 161(1) and 162 EPC dated Feb. 23, 2016; for European Application No. 14742423.8; 2 pages.
Communication Pursuant to Rules 161(1) and 162 dated Nov. 12, 2015 for European Application No. 14726492.3; 2 pages.
Daughton J: "Spin-dependent sensors", Proceedings of the IEEE New York, US, vol. 91. No. 5; May 2003; 6 pages.
Decision to Grant dated Oct. 27, 2016; for European Application No. 13722619.7; 2 pages.
Demierre, et al.; "Reference Magnetic Actuator for Self-Calibration of a Very Small Hall Sensor Array;" Sensors and Actuators A 97-98; Apr. 2002; 8 pages.
Dwyer; "Back-Biased Packaging Advances (SE, SG & SH versus SA & SB)," http://www.allegromicro.com/en/Products/Design/packaging_advances/index.asp, Copyright 2008; 5 pages.
European Communication under Rule 71(3) EPC, Intention to Grant dated Jun. 2, 2016 for European Application No. 13722619.7; 26 Pages.
European Extended Search Report dated Dec. 22, 2016; for European Application No. 16193227.2; 11 pages.
European Response filed on Aug. 24, 2016 to the official communication dated Feb. 23, 2016; for European Application No. 14742423. 8; 13 pages.
European Response to Written Opinion filed on May 21, 2015; for European Application No. 13722619.7, 9 pages.
Frick, et al.; "CMOS Microsystem for AC Current Measurement with Galvanic Isolation;" IEEE Sensors Journal; vol. 3, No. 6; Dec. 2003; 9 pages.
Halg; "Piezo-Hall Coefficients of n-Type Silicon;" Journal of Applied Physics; vol. 64, No. 1; Jul. 1, 1988; 7 pages.
Honeywell International, Inc., "Hall Effect Sensing and Application," Micro Switch Sensing and Control, Chapter 3, http://content.honeywell.com/sensing/prodinfo/solidstate/technical/hallbook.pdf, date unavailable but believed to be before Jan. 2008; 11 pages.
Hosticka; "CMOS Sensor Systems;" Sensors and Actuators A66; Apr. 1998; 7 pages.
Infineon Product Brief, TLE 4941plusC, Differential Hall IC for Wheel Speed Sensing, Oct. 2010, www.infineon.com/sensors, 2 pages.
Japanese Office Action (with English Translation) dated Jan. 13, 2017 for Japanese Application No. 2015-511491; 11 Pages.
Japanese Office Action (with English Translation) dated May 18, 2017 for Japanese Application No. 2015-511491; 8 Pages.
Japanese Office Action dated Jan. 18, 2017 for Japanese Application No. 2016-512930; 7 pages.
Japanese Voluntary Amendment with English Claims dated Dec. 28, 2016; for Japanese Pat. App. No. 2016-528006; 8 pages.
Johnson et al., "Hybrid Hall Effect Device," Appl. Phys. Lett., vol. 71, No. 7, Aug. 1997; 3 pages.
Kammerer et al.: "A Hall effect sensors network insensitive to mechanical stress;" Proceedings of IEEE Sensors; vol. 3, Oct. 2004; 4 pages.

(56) References Cited

OTHER PUBLICATIONS

Kanda et al.; "The Piezo-Hall Effect in n-Silicon;" $22^{nd}$ International Conference on the Physics of Semiconductors; vol. 1, Jan. 1995; 4 pages.
Kapser et al.; "Integrated GMR Based Wheel Speed Sensor for Automotive Applications;" IEEE 2007 Conference on Sensors; Oct. 2007; 4 pages.
Lagorce et al.; "Magnetic and Mechanical Properties of Micromachined Strontium Ferrite/Polyimide Composites;" Journal of Microelectromechanical Systems; vol. 6, No. 4; Dec. 1997; 6 pages.
Lequesne et al.; "High-Accuracy Magnetic Position Encoder Concept;" IEEE Transactions on Industry Applications; vol. 35, No. 3; May/Jun. 1999; 9 pages.
Magnani et al.; "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; 4 pages.
Manic et al.; "Short and Long-Term Stability Problems of Hall Plates in Plastic Packages;" IEEE $38^{th}$ Annual International Reliability Physics Symposium; Apr. 2000; 6 pages.
Manic; "Drift in Silicon Integrated Sensors and Circuits Due to the Thermo-Mechanical Stresses;"Lausanne, École Polytechnique Fédérale De Lausanne 2000; 176 pages.
Melexis Microelectronic Systems, Hall Applications Guide, Section 3—Applications, 1997; 48 pages.
Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; 7 pages.
Motz, et al.; "A Chopped Hall Sensor with Small Jitter and Programmable "True Power-On" Function;" IEEE Journal of Solid-State Circuits; vol. 40, No. 7; Jul. 2005; 8 pages.
Motz, et al.; "An Integrated Hall Sensor Platform Design for Position, Angle and Current Sensing;" IEEE Sensors 2006; Exco, Daegu, Korea / Oct. 22-25, 2006; 4 pages.
Munter; "A Low-offset Spinning-current Hall Plate;" Sensors and Actuators A21-A23; 1990; 4 pages.
Munter; "Electronic Circuitry for a Smart Spinning-current Hall Plate with Low Offset;" Sensors and Actuators A; Jun. 1991; 5 pages.
Notice of Allowance dated Apr. 19, 2017 for U.S. Appl. No. 13/891,519; 11 pages.
Notice of Allowance dated Apr. 5, 2019 for U.S. Appl. No. 15/606,362; 9 pages.
Notice of Allowance dated Jul. 25, 2017 for U.S. Appl. No. 13/468,478; 7 Pages.
Notice of Allowance dated Mar. 1, 2017 for U.S. Appl. No. 13/891,519; 7 pages.
Notice of Allowance dated May 15, 2017 for U.S. Appl. No. 13/468,478; 7 Pages.
Oniku et al.; "High-Energy-Density Permanent Micromagnets Formed from Heterogeneous Magnetic Powder Mixtures;" IEEE $25^{th}$ International Conference on Micro Electro Mechanical Systems, Jan. 2012; 4 pages.
Park et al.; "Ferrite-Based Integrated Planar Inductors and Transformers Fabricated at Low Temperature;"IEEE Transactions on Magnetics; vol. 33; No. 5; Sep. 1997; 3 pages.
Park et al.;"Batch-Fabricated Microinductors with Electroplated Magnetically Anisotropic and Laminated Alloy Cores", IEEE Transactions on Magnetics, vol. 35, No. 5, Sep. 1999, 10 pages.
Partin et al.; "Temperature Stable Hall Effect Sensors;" IEEE Sensors Journal, vol. 6, No. 1; Feb. 2006; 5 pages.
Pastre et al.; "A Hall Sensor Analog Front End for Current Measurement with Continuous Gain Calibration;" IEEE Sensors Journal; vol. 7, No. 5; May 2007; 8 pages.
Pastre et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; 4 pages.

PCT International Preliminary Report and Written Opinion dated Jan. 28, 2016 for International Application No. PCT/US2014/044991; 9 pages.
PCT International Preliminary Report dated Nov. 19, 2015 for International Application No. PCT/US2014/035594; 13 pages.
PCT International Preliminary Report on Patentability and Written Opinion of the ISA dated Nov. 20, 2014; for PCT Pat. App. No. PCT/US2013/037065; 11 pages.
PCT International Preliminary Report on Patentability dated Jan. 28, 2016 for International Application No. PCT/US2014/044993; 9 pages.
PCT International Search Report and Written Opinion dated Jul. 17, 2013 for International Application No. PCT/US2013/037065; 13 pages.
PCT International Search Report and Written Opinion dated Jul. 6, 2018 for International Application No. PCT/US2018/028476; 13 pages.
PCT International Search Report and Written Opinion dated Nov. 3, 2014 for International Application No. PCT/US2014/044993; 16 pages.
PCT International Search Report and Written Opinion dated Oct. 28, 2014 for International Application No. PCT/US2014/044991; 13 pages.
PCT International Search Report and Written Opinion dated Sep. 12, 2014 for International Application No. PCT/US2014/035594; 16 pages.
Popovic; "Sensor Microsystems;" Proc. $20^{th}$ International Conference on Microelectronics (MWIL 95); vol. 2, NIS, Serbia, 12-14; Sep. 1995; 7 pages.
Randhawa; "Monolithic Integrated Hall Devices in Silicon Circuits;" Microelectronics Journal; vol. 12, No. 6; Sep. 14-17, 1981; 6 pages.
Response (with Amended Claims in English) to Japanese Office Action dated Feb. 13, 2017 for Japanese Application No. 2015-511491; Response filed on Apr. 11, 2017; 11 pages.
Response (with RCE) to U.S. Final Office Action dated Aug. 28, 2015 for U.S. Appl. No. 13/946,417; Response filed Nov. 9, 2015; 17 pages.
Response (with RCE) to U.S. Final Office Action dated Feb. 16, 2016 for U.S. Appl. No. 13/891,519; Response filed May 12, 2016; 16 pages.
Response (with RCE) to U.S. Final Office Action dated Jul. 17, 2014 for U.S. Appl. No. 13/468,478; Response filed Jan. 19, 2015; 14 Pages.
Response (with RCE) to U.S. Final Office Action dated Nov. 25, 2016 for U.S. Appl. No. 13/891,519; Response filed Feb. 6, 2017; 18 pages.
Response (with RCE) to U.S. Final Office Action dated Oct. 20, 2016 for U.S. Appl. No. 13/946,400; Response filed Feb. 23, 2017; 17 Pages.
Response (with RCE) to U.S. Final Office Action dated Oct. 6, 2016 for U.S. Appl. No. 13/946,417; Response filed Jan. 24, 2017; 14 Pages.
Response (with RCE) to U.S. Final Office Action dated Sep. 16, 2015 for U.S. Appl. No. 13/468,478; Response filed Jan. 14, 2016; 18 pages.
Response to Communication dated Dec. 11, 2015 for European Application No. 14726492.3; 17 pages.
Response to Japanese Office Action dated Jan. 18, 2017 for Japanese Application No. 2016-512930; Response Filed Apr. 18, 2017; 13 pages.
Response to Official Communication dated Mar. 13, 2017 for European Application No. 16193227.2; 7 pages.
Response to U.S. Final Office Action dated Feb. 10, 2017 for U.S. Appl. No. 13/468,478; Response filed May 3, 2017; 9 Pages.
Response to U.S. Final Office Action dated Oct. 20, 2016 for U.S. Appl. No. 13/946,400; Response filed Jan. 19, 2017; 12 Pages.
Response to U.S. Non-Final Office Action dated Apr. 6, 2017 for U.S. Appl. No. 13/946,400; Response filed Jun. 30, 2017; 12 pages.
Response to U.S. Non-Final Office Action dated Aug. 24, 2015 for U.S. Appl. No. 13/891,519; Response filed Nov. 20, 2015; 11 pages.
Response to U.S. Non-Final Office Action dated Dec. 3, 2015 for U.S. Appl. No. 13/946,417; Response filed Mar. 3, 2016; 17 pages.

(56) References Cited

OTHER PUBLICATIONS

Response to U.S. Non-Final Office Action dated Feb. 12, 2015 for U.S. Appl. No. 13/468,478; Response filed Jun. 18, 2015; 11 Pages.
Response to U.S. Non-Final Office Action dated Jan. 15, 2014 for U.S. Appl. No. 13/468,478; Response filed Jun. 12, 2014; 11 Pages.
Response to U.S. Non-Final Office Action dated Jan. 24, 2019 for U.S. Appl. No. 15/606,358; Response filed Apr. 17, 2019; 12 pages.
Response to U.S. Non-Final Office Action dated Jan. 5, 2015; for U.S. Appl. No. 13/946,400; Response filed Apr. 3, 2015; 13 pages.
Response to U.S. Non-Final Office Action dated Jun. 3, 2016 for U.S. Appl. No. 13/891,519; Response filed Sep. 1, 2016; 14 pages.
Response to U.S. Non-Final Office Action dated Mar. 15, 2017 for U.S. Appl. No. 13/946,417; Response filed Jun. 14, 2017; 10 pages.
Response to U.S. Non-Final Office Action dated Mar. 20, 2015 for U.S. Appl. No. 13/946,417; Response filed Jun. 19, 2015; 15 pages.
Response to U.S. Non-Final Office Action dated May 10, 2016 for U.S. Appl. No. 13/468,478; Response filed Oct. 3, 2016; 17 pages.
Response to U.S. Non-Final Office Action dated Nov. 19, 2015 for U.S. Appl. No. 13/946,400; Response filed Feb. 17, 2016; 11 Pages.
Response to U.S. Non-Final Office Action dated Oct. 31, 2018 for U.S. Appl. No. 15/606,362; Response filed Jan. 31, 2019; 11 pages.
Response with RCE to U.S. Final Office Action dated Jun. 9, 2015 for U.S. Appl. No. 13/946,400; Response with RCE filed Sep. 9, 2015; 12 pages.
Ruther et al.; "Integrated CMOS-Based Sensor Array for Mechanical Stress Mapping;" $5^{th}$ IEEE Conference on Sensors; Oct. 22-25, 2006; 4 pages.
Ruther et al.; "Thermomagnetic Residual Offset in Integrated Hall Plates;" IEEE Sensors Journal; vol. 3, No. 6; Dec. 2003; 7 pages.
Sargent; "Switched-capacitor IC controls feedback loop;" EDN; Design Ideas; Feb. 17, 2000; 2 pages.
Schneider; "Temperature Calibration of CMOS Magnetic Vector Probe for Contactless Angle Measurement System," IEDM 1996; 4 Pages.
Schott et al.; "Linearizing Integrated Hall Devices;" 1997 International Conference on Solid-State Sensors and Actuators; Jun. 16-19, 1997; 4 Pages.
Schott, et al.; "CMOS Single-Chip Electronic Compass with Microcontroller;" IEEE Journal of Solid-State Circuits; vol. 42, No. 12; Dec. 2007; 11 pages.
Simon et al.; "Autocalibration of Silicon Hall Devices;" $8^{th}$ International Conference on Solid-State Sensors and Actuators; vol. 2; Jun. 25-29, 1995; 4 pages.
Smith et al.; "Low Magnetic Field Sensing with GMR Sensors;" Sensor Magazine; Part 1; Sep. 1999; http://archives.sensorsmag.com/articles/0999/76mail.shtml; 8 pages.
Smith et al.; "Low Magnetic Field Sensing with GMR Sensors;" Sensor Magazine; Part 2; Oct. 1999; http://archives.sensorsmag.com/articles/1099/84/mail.shtml; 11 pages.
Steiner et al.; "Double-Hall Sensor with Self-Compensated Offset;" International Electron Devices Meeting; Dec. 7, 1997; ISBN: 0-7803-4100-7; 4 pages.
Steiner et al; Offset Reduction in Hall Devices by Continuous Spinning Current Method; Sensors and Actuators A66; 1998; 6 pages.
Stellrecht et al.; Characterization of Hygroscopic Swelling Behavior of Mold Compounds and Plastic Packages; IEEE Transactions on Components and Packaging Technologies; vol. 27, No. 3; Sep. 2004; 8 pages.
Tian et al.; "Multiple Sensors on Pulsed Eddy-Current Detection for 3-D Subsurface Crack Assessment;" IEEE Sensors Journal; vol. 5, No. 1; Feb. 2005; 7 pages.
Trontelj et al; "CMOS Integrated Magnetic Field Source Used as a Reference in Magnetic Field Sensors on Common Substrate;" WEP 1-6; IMTC; May 1994; 3 pages.

U.S. Advisory Action dated Feb. 16, 2017 for U.S. Appl. No. 13/946,400; 4 Pages.
U.S. Final Office Action dated Aug. 28, 2015; for U.S. Appl. No. 13/946,417; 30 pages.
U.S. Final Office Action dated Feb. 10, 2017 for U.S. Appl. No. 13/468,478; 17 Pages.
U.S. Final Office Action dated Feb. 16, 2016 for U.S. Appl. No. 13/891,519; 14 pages.
U.S. Final Office Action dated Jul. 17, 2014 for U.S. Appl. No. 13/468,478; 13 Pages.
U.S. Final Office Action dated Jun. 9, 2015; for U.S. Appl. No. 13/946,400; 17 pages.
U.S. Final Office Action dated Nov. 25, 2016 for U.S. Appl. No. 13/891,519; 13 pages.
U.S. Final Office Action dated Oct. 20, 2016 for U.S. Appl. No. 13/946,400; 20 pages.
U.S. Final Office Action dated Oct. 5, 2017 for U.S. Appl. No. 13/946,400; 27 pages.
U.S. Final Office Action dated Oct. 6, 2016; for U.S. Appl. No. 13/946,417; 34 pages.
U.S. Final Office Action dated Sep. 16, 2015 for U.S. Appl. No. 13/468,478; 19 Pages.
U.S. Final Office Action dated Sep. 8, 2017 for U.S. Appl. No. 13/946,417; 26 pages.
U.S. Non-Final Office Action dated Apr. 6, 2017 for U.S. Appl. No. 13/946,400; 25 Pages.
U.S. Non-Final Office Action dated Aug. 24, 2015 for U.S. Appl. No. 13/891,519; 14 pages.
U.S. Non-Final Office Action dated Dec. 3, 2015; for U.S. Appl. No. 13/946,417; 26 pages.
U.S. Non-Final Office Action dated Feb. 12, 2015 for U.S. Appl. No. 13/468,478; 14 Pages.
U.S. Non-Final Office Action dated Jan. 15, 2014 for U.S. Appl. No. 13/468,478; 9 pages.
U.S. Non-Final Office Action dated Jan. 5, 2015 for U.S. Appl. No. 13/946,400; 24 Pages.
U.S. Non-Final Office Action dated Jun. 3, 2016 for U.S. Appl. No. 13/891,519; 17 pages.
U.S. Non-Final Office Action dated Mar. 15, 2017 from U.S. Appl. No. 13/946,417; 25 Pages.
U.S. Non-Final Office Action dated Mar. 20, 2015; for U.S. Appl. No. 13/946,417; 20 pages.
U.S. Non-Final Office Action dated May 10, 2016 for U.S. Appl. No. 13/468,478; 15 Pages.
U.S. Non-Final Office Action dated Nov. 19, 2015; for U.S. Appl. No. 13/946,400; 19 pages.
U.S. Non-Final Office Action dated Oct. 31, 2018 for U.S. Appl. No. 15/606,362; 15 pages.
Udo; "Limits of Offset Cancellation by the Principle of Spinning Current Hall Probe;" Proceedings of IEEE Sensors; Oct. 2004; 4 pages.
Voluntary Amendment dated Nov. 2, 2016 with English claims for Chinese Application No. 201480040243.6; 13 pages.
Voluntary Amendment with English Claims dated Nov. 7, 2016 for Korean App. No. 10-2016-7004178; 11 Pages.
Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; 3 pages.
Zou et al.; "Three-Dimensional Die Surface Stress Measurements in Delaminated and Non-Delaminated Plastic Packages;" 48th Electronic Components and Technology Conference; May 25, 1998; 12 pages.

* cited by examiner

COIL ACTUATED PRESSURE SENSOR AND DEFORMABLE SUBSTRATE

FIELD

This disclosure relates to pressure sensors and, more particularly, to pressure sensors including a coil actuated magnetic field sensor.

BACKGROUND

Magnetic field sensors are often used to detect a ferromagnetic target. They often act as sensors to detect motion or position of the target. Such sensors are ubiquitous in many areas of technology including robotics, automotive, manufacturing, etc. For example, a magnetic field sensor may be used to detect when a vehicle's wheel locks up, triggering the vehicle's control processor to engage the anti-lock braking system. In this example, the magnetic field sensor may detect rotation of the wheel. Magnetic field sensors may also detect distance between the magnetic field sensor and an object. Sensors such as these may be used to detect the proximity of the object as it moves toward and away from the magnetic field sensor.

In some applications, if the gap between the sensor and the object being sensed is relatively large, the sensor may not be able to determine a position of the target with great accuracy.

SUMMARY

According to the disclosure, a pressure sensor includes a deformable substrate, at least one coil supported by the substrate and responsive to a changing coil drive signal to produce a changing magnetic field, a fluid chamber having a first wall formed by the substrate and a second wall formed by a conductive material and positioned proximate to the at least one coil so that the changing magnetic field produces eddy currents within the conductive material that generate a reflected magnetic field, and at least one magnetic field sensing element configured to detect the reflected magnetic field and produce a signal responsive to a distance between the magnetic field sensing element and the second wall. The substrate is deformable by fluid pressure within the fluid chamber and the deformation of the substrate changes the distance between the magnetic field sensing element and the second wall.

One or more of the following features may be included.

The substrate may be a semiconductor substrate.

The substrate may include a through-silicon via.

The substrate may be in a flip-chip position with the at least one magnetic field sensing element positioned between the at least one coil and the second wall.

The substrate may be in a die-up position with the at least one coil positioned between the at least one magnetic field sensing element and the second wall.

An adhesive may be used to adhere the substrate to the second wall. The adhesive may include one or more of an anodic bond, a metal to glass seal, or an adhesive bond.

The adhesive may be between the substrate and the second wall.

A thickness of the adhesive may form a gap between the substrate and the second wall.

The adhesive may cover an edge of the substrate.

The fluid chamber may include a third wall formed by a conductive material and positioned proximate to a second coil that produces a second changing magnetic field, wherein the second changing magnetic field may produce second eddy currents within the conductive material of the third wall that may generate a second reflected magnetic field.

A second magnetic field sensing element may be configured to detect the second reflected magnetic field and produce a signal responsive to a distance between the second magnetic field sensing element and the third wall.

At least one bond wire may be coupled to the substrate.

The second wall may include a notch and the substrate may be positioned in the notch.

A strain gauge may be supported by the substrate and configured to generate an output signal representing a strain on the substrate caused by the deformation of the substrate.

According to a further aspect, a system includes a processor, a pressure sensor electrically coupled to the processor and configured to generate a signal response to a fluid pressure. The pressure sensor includes a deformable substrate, at least one coil supported by the substrate and responsive to a changing coil drive signal to produce a changing magnetic field, a fluid chamber having a first wall formed by the substrate and a second wall formed by a conductive material and positioned proximate to the at least one coil so that the changing magnetic field produces eddy currents within the conductive material that generate a reflected magnetic field, and at least one magnetic field sensing element configured to detect the reflected magnetic field and produce a signal responsive to a distance between the magnetic field sensing element and the second wall. The substrate is deformable by fluid pressure within the fluid chamber and the deformation of the substrate changes the distance between the magnetic field sensing element and the second wall.

One or more of the following features may be included.

The substrate may comprise a through-silicon via.

The substrate may be positioned in a flip-chip position with the at least one magnetic field sensing element positioned between the at least one coil and the second wall.

The substrate may be positioned in a die up position with the at least one coil positioned between the at least one magnetic field sensing element and the second wall.

An adhesive may be used to adhere the substrate to the second wall. The adhesive may include one or more of an anodic bond, a metal to glass seal, or an adhesive bond.

The adhesive may be positioned between the substrate and the second wall.

The adhesive may cover an edge of the substrate.

The fluid chamber may include a third wall formed by a conductive material and positioned proximate to a second coil that produces a second changing magnetic field, wherein the second changing magnetic field produces second eddy currents within the conductive material of the third wall that generate a second reflected magnetic field.

A second magnetic field sensing element may be configured to detect the second reflected magnetic field and produce a signal responsive to a distance between the second magnetic field sensing element and the third wall.

At least one bond wire may be coupled to the substrate.

In another embodiment, a pressure sensor includes a substrate that forms a wall of a chamber, a conductive target that forms a second wall of the chamber, means for detecting a distance between the substrate and the second wall of the chamber, and means for changing the distance between the substrate and the conductive target in response to a change in pressure within the chamber.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1:
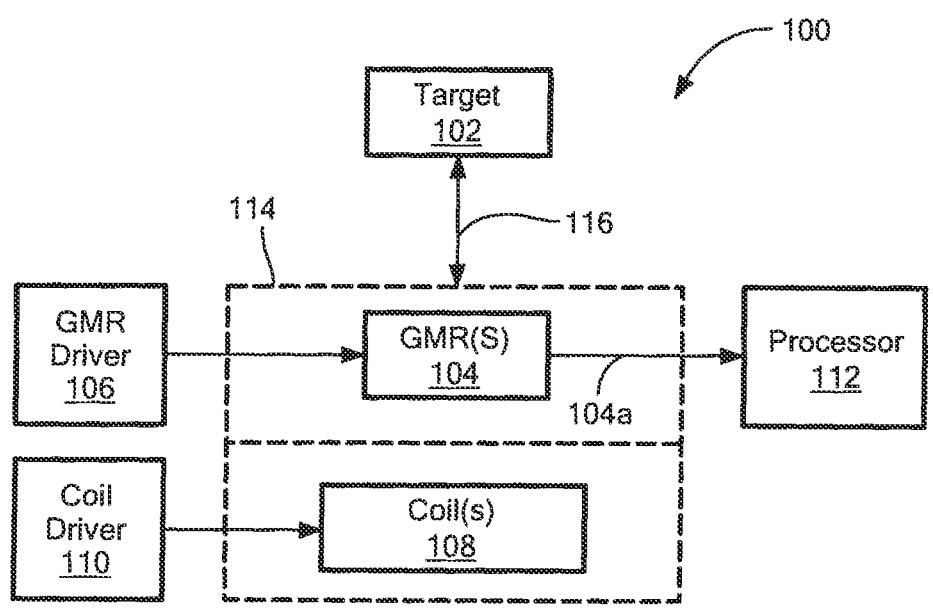
FIG. 1 is a block diagram of a magnetic field sensor with coil actuation.

FIG. 1 is a block diagram of a system 100 for detecting a conductive target 102. Target 102 may be magnetic or non-magnetic in various embodiments. System 100 includes one or more magnetoresistance (MR) elements 104 and an MR driver circuit 106. MR driver circuit 106 may include a power supply or other circuit that provides power to MR elements 104. In embodiments, MR elements 104 may be replaced with other types of magnetic field sensing elements such as Hall effect elements, etc. MR elements 104 may comprise a single MR element or multiple MR elements. The MR elements may be arranged in a bridge configuration, in certain embodiments.

System 100 may also include one or more coils 108 and a coil driver circuit 110. Coils 108 may be electrical coils, windings, wires, traces, etc. configured to generate a magnetic field when current flows through the coils 108. In embodiments, coils 108 comprise two or more coils, each a conductive trace supported by substrate, such as a semiconductor substrate, a glass substrate, a ceramic substrate, or the like. In other embodiments, coils 108 may not be supported by a substrate. For example, coils 108 may be supported by a chip package, a frame, a PCB, a ceramic substrate, or any other type of structure that can support traces of a coil. In other embodiments, coils 108 may be free standing wire, i.e. a wire wound coil not supported by a separate supporting structure.

Coil driver 110 is a power circuit that supplies current to coils 108 to generate the magnetic field. In an embodiment, coil driver 110 may produce a changing current, such as a pulsed current, a ramped current, an alternating current, or any other shaped current that changes over time so that coils 108 produce changing magnetic fields (i.e. magnetic fields with magnetic moments that change over time). Coil driver 110 may be a circuit implemented, in whole or in part, on the semiconductor die.

System 100 may also include processor 112 coupled to receive signal 104a from MR elements 104, which may represent the magnetic field as detected by MR elements 104. Processor 100 may receive signal 104a and use it to determine a position, speed, direction, or other property of target 102.

MR elements 104 and coils 108 may be positioned on substrate 114. Substrate 114 may comprise semiconductor substrates, such as silicon substrates, a chip package, PCB or other type of board-level substrates, or any type of platform that can support MR elements 104 and coils 108. Substrate 114 may include a single substrate or multiple substrates, as well as a single type of substrate or multiple types of substrates.

In operation, MR driver circuit 106 provides power to MR elements 104 and coil driver 110 provides current to coils 108. In response, coils 108 produce a magnetic field that can be detected by MR elements 104, which produce signal 104a representing the detected magnetic field.

In embodiments, system 100 may detect changes in the distance along axis 116 between target 102 and MR elements 104. The distance along axis 116 can change if target 102 moves along axis 116 while MR elements 104 are stationary, if MR elements 104 move along axis 116 while target 102 is stationary, or if both MR elements 104 and target 102 move along axis 116 to increase or decrease the distance between target 102 and MR elements 104.

As target 102 moves in relation to the magnetic field (e.g. in relation to MR elements 104), its position and movement through the field changes the field. In response, signal 104a produced by MR elements 104 changes. Processor 112 receives signal 104a and processes the changes in (and/or the state of) the signal to determine position, movement, or other characteristics of target 102. In an embodiment, system 100 can detect movement or position of target 102 along axis 116. In other words, system 100 may detect the position of target 102 in proximity to MR elements 104 as target 102 moves toward or away from MR elements 104 and coils 108. System 102 may also be able to detect other types of position or movement of target 102.

Figure 2A:
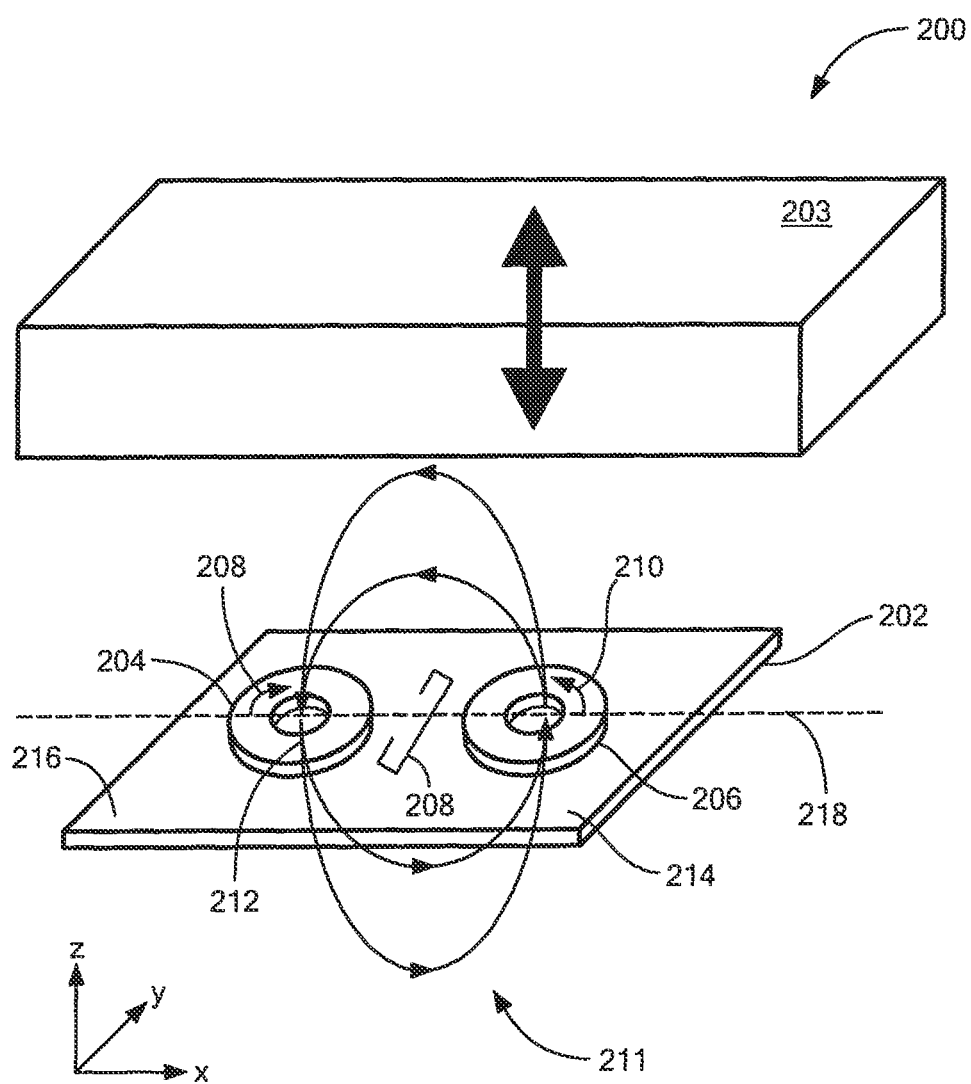
FIG. 2A is a perspective view of a magnetic field sensor with coil actuation.

Referring now to FIG. 2A, system 200 may be the same as or similar to system 100. Substrate 202 may be the same as or similar to substrate 114, and may support coil 204, coil 206, and MR element 208. Although one MR element is shown, MR element 208 may comprise two or more MR elements depending on the embodiment of system 200. Target 203 may be the same as or similar to target 102. Target 203, substrate 202, or both may move closer and/or further away from each other along the Z axis to change the distance between them.

Although not shown, an MR driver circuit 106 may provide current to MR element 208 and coil driver circuit 110 may provide current to coils 204 and 206.

Coil 204 and 206 may be arranged so that the current flows through coils 204 and 206 in opposite directions, as shown by arrow 208 (indicating a clockwise current in coil 204) and arrow 210 (indicating a counterclockwise current in coil 206). As a result, coil 204 may produce a magnetic field having a magnetic moment in the negative Z direction (i.e. down, in FIG. 2A), as indicated by arrow 212. Similarly, coil 206 may produce a magnetic field having a magnetic moment in the opposite direction, the positive Z direction, as indicated by arrow 214. An aggregate magnetic field 211 produced by both coils may have a shape similar to that shown by magnetic field lines 211. It will be appreciated that coils 204, 206 may be formed by a single coil structure respectively wound so that the current through the coils flows in opposite directions. Alternatively, coils 204, 206 may be formed by separate coil structures.

In an embodiment, MR element 208 may be placed between coils 204 and 206. In this arrangement, absent any other magnetic fields aside from those produced by coils 204 and 206, the net magnetic field at MR element 208 may be zero. For example, the negative Z component of the magnetic field produced by coil 204 may be canceled out by the positive Z component of the magnetic field produced by coil 206, and the negative X component of the magnetic field shown above substrate 202 may be canceled out by the positive X component of the magnetic field shown below substrate 202. In other embodiments, additional coils may be added to substrate 202 and arranged so that the net magnetic field at MR element 208 is substantially nil.

To achieve a substantially zero magnetic field at the location of MR element 208, coil 204 and coil 206 may be placed so that current through the coils flows in circular patterns substantially in the same plane. For example, the current through coil 204 and 206 is flowing in circular patterns through the coils. As shown, those circular patterns are substantially coplanar with each other, and with the top surface 216 of substrate 202.

As noted above, coil driver 110 may produce an alternating field. In this arrangement, the magnetic field shown by magnetic field lines 211 may change direction and magnitude over time. However, during these changes, the magnetic field at the location of MR element 208 may remain substantially nil.

In operation, as target 203 moves toward and away from MR element 208 (i.e. in the positive and negative Z direction), magnetic field 211 will cause eddy currents to flow within target 203. These eddy currents will create their own magnetic fields, which will produce a non-zero magnetic field in the plane of the MR element 208, which non-zero magnetic field can be sensed to detect the motion or position of target 203.

Figure 2B:
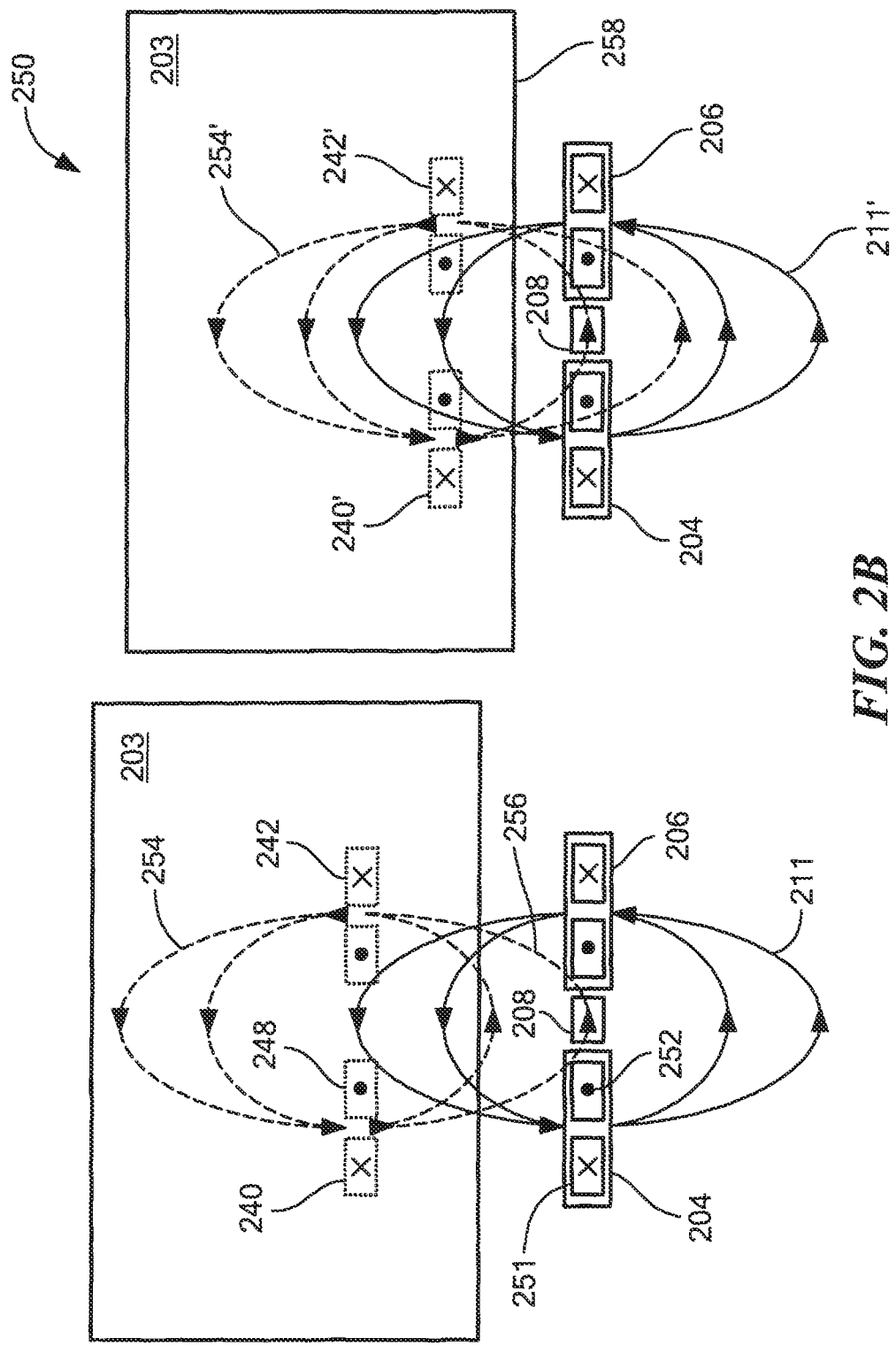
FIG. 2B is a block diagram of a magnetic field sensor with coil actuation.

Referring to FIG. 2B, a cross-sectional view 250 of system 200, as viewed at line 218 in the Y direction, illustrates the eddy currents within target 203. The 'x' symbol represents a current flowing into the page and the symbol represents a current flowing out of the page. As noted above, the current through coils 204 and 206 may be an alternating current, which may result in an alternating strength of magnetic field 211. In embodiments, the phase of the alternating current through coil 204 matches the phase of the alternating current through coil 206 so that magnetic field 211 is an alternating or periodic field.

Alternating magnetic field 211 may produce reflected eddy currents 240 and 242 within magnetic or conductive target 203. Eddy currents 240 and 242 may be opposite in direction to the current flowing through coils 204 and 206, respectively. As shown, eddy current 240 flows out of the page and eddy current 248 flows into the page, while coil current 251 flows into the page and current 252 flows out of the page. Also, as shown, the direction of eddy current 242 is opposite the direction of the current through coil 206.

Eddy currents 240 and 242 form a reflected magnetic field 254 that has a direction opposite to magnetic field 211. As noted above, MR element 208 detects a net magnetic field of zero due to magnetic field 211. However, MR element 208 will detect a non-zero magnetic field in the presence of reflected magnetic field 256. As illustrated by magnetic field line 256, the value of reflected magnetic field 254 is non-zero at MR element 208.

As target 203 moves closer to coils 204 and 206, magnetic field 211 may produce stronger eddy currents in target 203. As a result, the strength of magnetic field 254 may change. In FIG. 2B, magnetic field 211' (in the right-hand panel of FIG. 2B) may represent a stronger magnetic field than magnetic field 211 due, for example, to the closer proximity of target 203 to coils 204 and 206. Thus, eddy currents 240' and 242' may be stronger currents than eddy currents 240 and 242, and magnetic field 254' may be stronger than magnetic field 254. This phenomenon may result in MR element 208 detecting a stronger magnetic field (i.e. magnetic field 254') when target 203 is closer to coils 204 and 206, and a weaker magnetic field (i.e. magnetic field 254) when target 203 is further away from coils 204 and 206.

Also, eddy currents 240' and 242' generally occur on or near the surface of target 203. Therefore, as target 203 moves closer to MR element 208, MR element 208 may experience a stronger magnetic field from the eddy currents because the source of the reflected magnetic field is closer to MR element 208. Note that, for ease of illustration, the eddy currents appear in the center of target 203 in the drawing. In an actual device, the eddy currents may occur at or near the surface or "skin" of target 203.

Figure 3A:
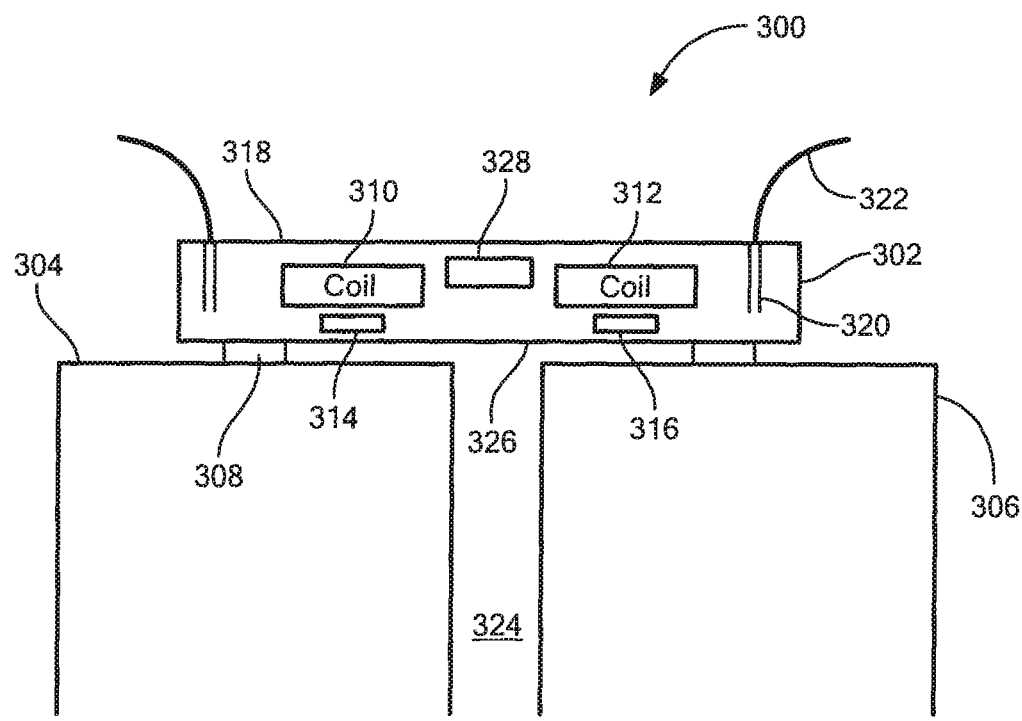
FIGS. 3A, 3B, 4A, 4B, 5A, 5B, 6A, and 6B are cross-sectional diagrams of coil actuated pressure sensors.

Referring also to FIG. 3A, a pressure sensor 300 (shown in cross-section) includes a substrate 302 coupled to conductive target 304 and conductive target 306. Substrate 302 may be attached to conductive targets 304 and 306 by an adhesive 308. Substrate 302 may be a semiconductor substrate such as silicon, a glass material, a ceramic material, or any other material that can support integrated circuitry. Conductive targets 304 and 306 may be formed from a conductive metal such as copper, aluminum, steel, stainless steel, or any other metal. Conductive targets 304 and 306 may also be formed from non-metallic conductive material such as conductive polymer, graphene, nanomaterial or a composite material comprising conductive nanomaterial, etc.

Substrate 302 may support coil 310 and coil 312, which may be coupled to a coil driver (like coil driver 110 in FIG. 1) that drives a changing current through coil 310 and/or coil 312. Substrate 302 may also support magnetic field sensing elements 314 and 316. Magnetic field sensing elements 314 and 316 may be MR elements, Hall effect elements, or any other type of element that can detect a magnetic field.

Substrate 302 may be provided in a flip chip face down position. In this arrangement, magnetic field sensing element 314 may be positioned between coil 310 and target 304 and magnetic field sensing element 316 may be positioned between coil 312 and target 306.

Substrate 302 may include vias, such as a through-silicon via ("TSV") 320, that connects elements 314, 316 and other circuitry supported by substrate surface 326 to metallic interconnects on substrate surface 318. The via(s) and/or metallic interconnects may be coupled to bond wires like bond wire 322, balls in a ball grid array, or any other type of electrical interconnect that can connect integrated circuitry on substrate 302 to other off-chip circuits.

Adhesive 308 can attach the substrate 302 to walls of targets 304, 306 in a manner that permits deformation, or deflection of the substrate without sacrificing the mechanical attachment of the parts and while ensuring a fluid (e.g., gas) tight seal. Various materials and techniques are possible for implementing adhesive 308. It will be appreciated that the term "adhesive" is used herein to broadly describe structures, materials, and techniques for reliably securing the substrate 302 to the targets 304, 306 in a fluid tight manner that permits deformation of the substrate.

By way of non-limiting examples, adhesive 308 can represent an anodic bond, a metal (or wafer) to glass seal, and/or an adhesive bond. Suitable adhesive bonds may include a glass bonding adhesive, polymer adhesive, epoxy, joint compound, and/or silicone. A metal to glass seal may include an oxide layer on the surface of one or both of the substrate and the target walls. Although not shown, gaskets may be used as the seal. Other techniques such as soldering, brazing, may form all or part of the adhesive 308. Seals such as glass (or oxide) metal seals or silicon-to-glass seals may be used.

In an embodiment, the substrate 302 may be formed so as to have pillars (as labeled 308) with the substrate recessed with respect to the pillars. The silicon pillars 308 may be connected to the targets 304, 306. For example, the silicon pillars 308 can be oxidized to allow for an oxide to metal bond to be formed. Pillars 308 could be provided in the form of a ring, either round, square, or rectangular, or other shape.

Notwithstanding these examples, any fastener or fastening technique may be used to fasten substrate 302 to walls of targets 304, 306 and form a gas-tight seal in a manner that permits substrate deflection.

Substrate 302 may also support strain gauge 328, which may be configured to detect a stress, strain, or deformation of substrate 302. In embodiments, strain gauge 328 may comprise a Hall plate, a piezoelectric element, or any other type of device that can detect deformation or bending of substrate 302.

Targets 304 and 306, and substrate 302 may be coupled together to form the walls of pressure chamber 324 that may contain a fluid material such as gas or liquid. The fluid within chamber 324 may be under pressure and may exert force on surface 326 of substrate 320. As the pressure within chamber 324 changes, the force exerted on surface 326 may also change.

Figure 3B:
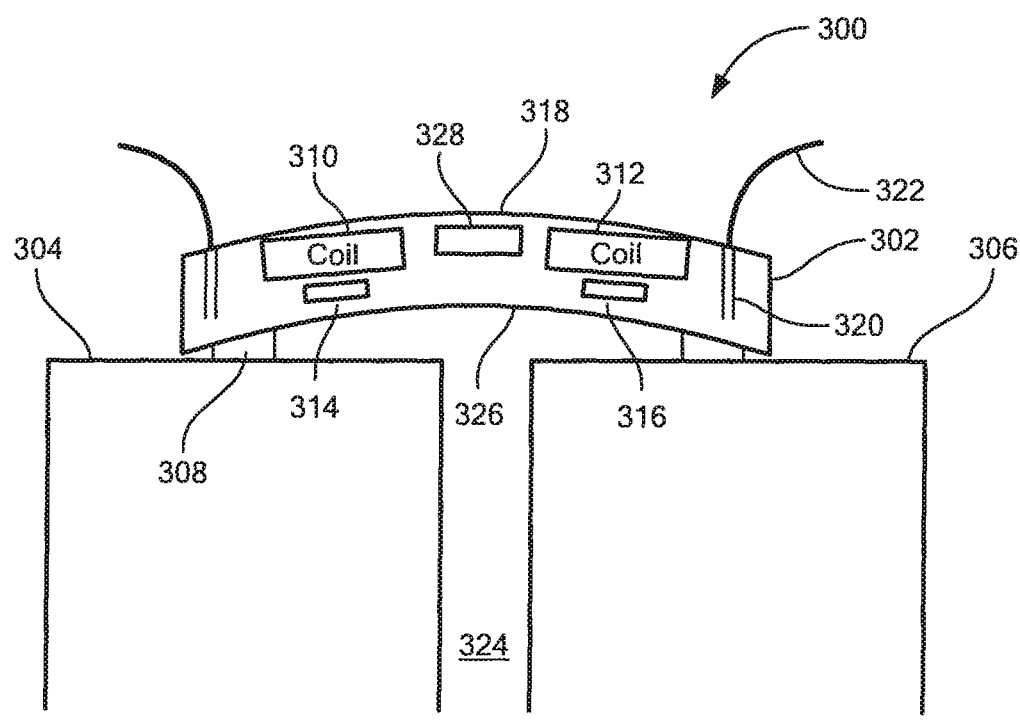

In FIG. 3B, the pressure within chamber 324 has increased with respect to the pressure in FIG. 3A. Thus, substrate 302 has deformed thereby increasing the distance between magnetic field sensing element 314 and target 304, and the distance between magnetic field sensing element 316 and target 306.

In operation, coil driver 110 (see FIG. 1) may drive a changing current through coils 310 and 312. In response, coils 310 and 312 may generate changing magnetic fields. Like the examples described in relation to FIG. 1, FIG. 2A, and FIG. 2B, the changing magnetic field generated by coils 310 and 312 may induce eddy currents in targets 304 and 306, respectively. The eddy currents may generate reflected magnetic fields that can be detected by magnetic field sensing elements 314 and 316. The magnitude of the reflected magnetic field may be proportional to the distance between the respective target and the respective magnetic field sensing element. Thus, the signal produced by magnetic field sensing element 314 may represent a distance between magnetic field sensing element 314 and target 304 and the signal produced by magnetic field sensing element 316 may represent a distance between magnetic field sensing element 316 and target 306.

As the pressure within chamber 324 changes, substrate 302 may deform and flex. As a result, the distance between magnetic field sensing element 314 and target 304 and the distance between magnetic field sensing element 316 and target 306 may change. Accordingly, the signals produced by magnetic field sensing elements 314 and 316 may change as the pressure changes. These signals may be received by a processor (e.g. processor 112), which may correlate the signals to a pressure within chamber 324. In embodiments, processor 112 may use a predetermined lookup table, formula, or other data structures and/or calculations to correlate the output of magnetic field sensing elements 314 and 316 to a pressure within chamber 324.

Also, as substrate 302 flexes (e.g. deforms), strain gauge 328 may detect the flexion and produce a signal representing the flexion. Thus, strain gauge 328 may also provide a signal that can be correlated to pressure within chamber 324. In embodiments, processor 112 may use a predetermined lookup table, formula, or other data structures and/or calculations to correlate the output of strain gauge 328 to a pressure within chamber 324.

The signal produced by strain gauge 328 may be used as a redundant signal representing the pressure, may be used as a fail-safe signal to detect if substrate 302 is in danger of damage under the pressure of chamber 324, or may be used for other purposes.

In embodiments, as substrate 302 flexes, the distance between the magnetic field sensing elements and the target changes by a relatively small amount. The precision and accuracy of pressure sensor 300 may be high because magnetic field sensing elements 314 and 316 are close to target 304 and 306. In embodiments, pressure sensor 300 may be able to determine the distance between the magnetic field sensing elements and the targets (and thus the pressure within chamber 324) to a 10-bit to 12-bit accuracy. The deflection distance of the substrate can vary depending on the thickness and diameter of the substrate. As one example, the substrate may be formed from a 300 μm thick, 4 mm square die under 100 bar of pressure, yielding 5 μm of deflection. This 5 μm of deflection/4096 (for 12 bits of resolution) can provide a distance resolution in the 1 to 5 nm range.

In some embodiments, a thinned wafer region (i.e., region of the substrate) could be used to form a deflectable membrane over a portion of the substrate; for example, the portion where the coils and sensing elements are located. For example, such a membrane could have a thickness on the order of 10 to 100 μm and may have various shapes, such as a square, rectangle, or even a circular membrane.

Figure 4A:
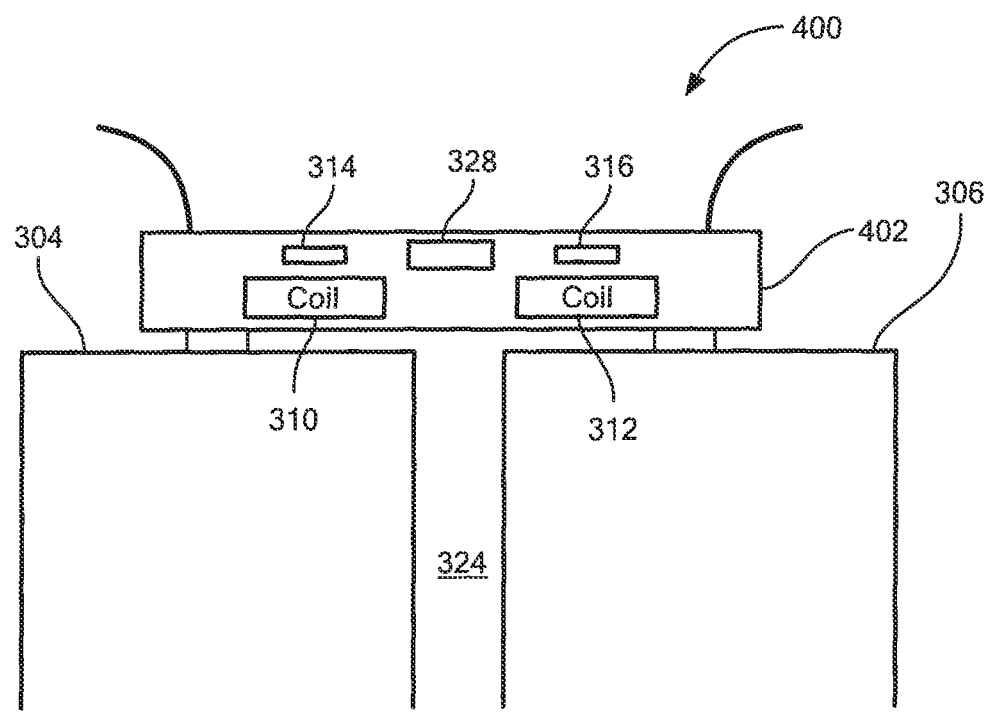

Referring to FIG. 4A, pressure sensor 400 may be similar to pressure sensor 300, however substrate 302 may be replaced with substrate 402. In embodiments, substrate 402 may be in a die-up position. Thus, coil 310 may be positioned between magnetic field sensing element 314 and target 304, and coil 312 may be positioned between magnetic field sensing element 316 and target 306. In this embodiment, the magnetic field produced by coil 310 may still induce eddy currents and a reflected magnet field in target 304 that can be detected by magnetic field sensing element 314, and the magnetic field produced by coil 312 may still induce eddy currents and a reflected magnetic field in target 306 that can be detected by magnetic field sensing element 316.

Figure 4B:
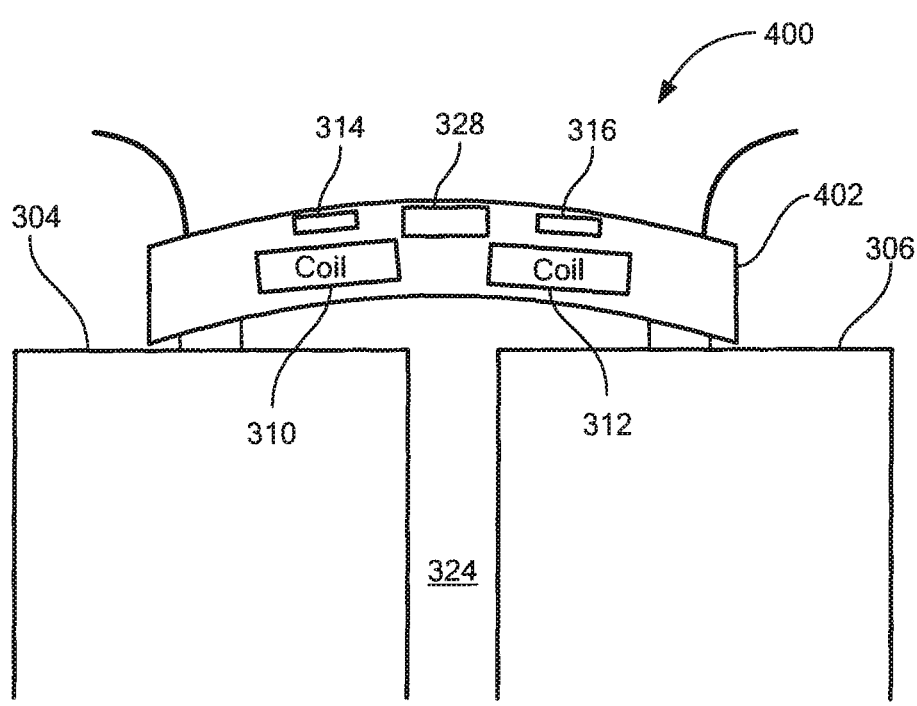

In FIG. 4B, the pressure within chamber 324 has increased with respect to the pressure in FIG. 4A. Thus, substrate 402 has deformed and increased the distance between magnetic field sensing element 314 and target 304, and the distance between magnetic field sensing element 316 and target 306. As the distance changes, magnetic field sensing elements 314 and 316 may detect the change in distance by detecting a change in the reflected magnetic fields. The output signals of the magnetic field sensing elements may then be used (e.g. by processor 118) to determine a pressure within chamber 324.

Strain gauge 328 may also be used to detect a strain or deformation of substrate 402. Thus, the output of strain gauge 328 may be used by processor 112 (FIG. 1) to determine a pressure within chamber 324.

Figure 5A:
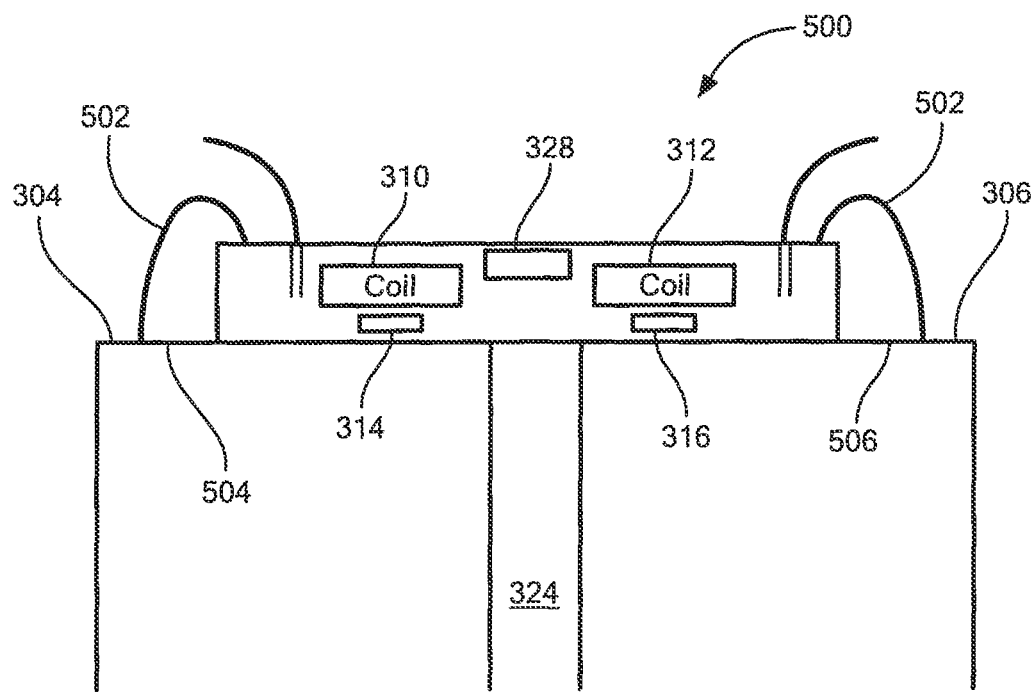
Figure 5B:
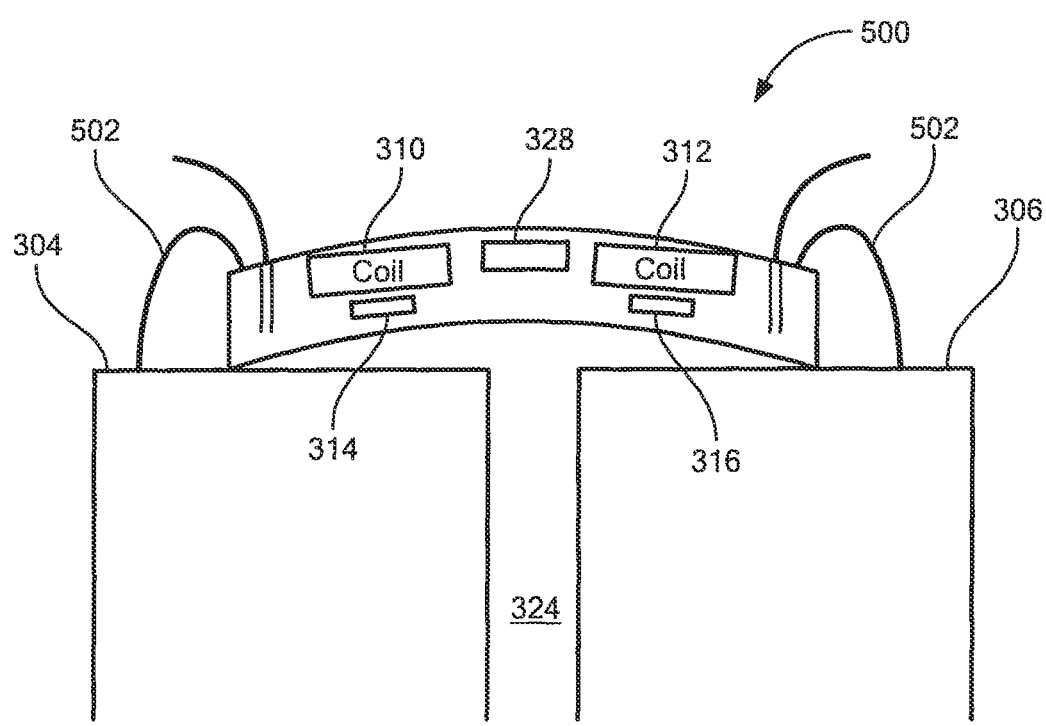

Referring to FIGS. 5A and 5B, pressure sensor 500 may be the same as or similar to pressure sensor 300. However, substrate 302 may be attached to targets 304 and 306 by adhesive 502. Adhesive 502 may be positioned over or around the edge of substrate 302 and attached to target 304 at position 504 and to target 306 at position 506. In this embodiment, substrate 302 may be in direct contact with target 304 and/or 306 because the adhesive is not positioned between substrate 302 and targets 304 and 306. In some instances, to prevent flow of current between substrate 302 and the targets, an insulative layer may be positioned between substrate 302 and the targets. FIG. 5A shows substrate 302 in a non-deformed state and FIG. 5B shows substrate 302 in a deformed state due to greater pressure within chamber 324.

Figure 6A:
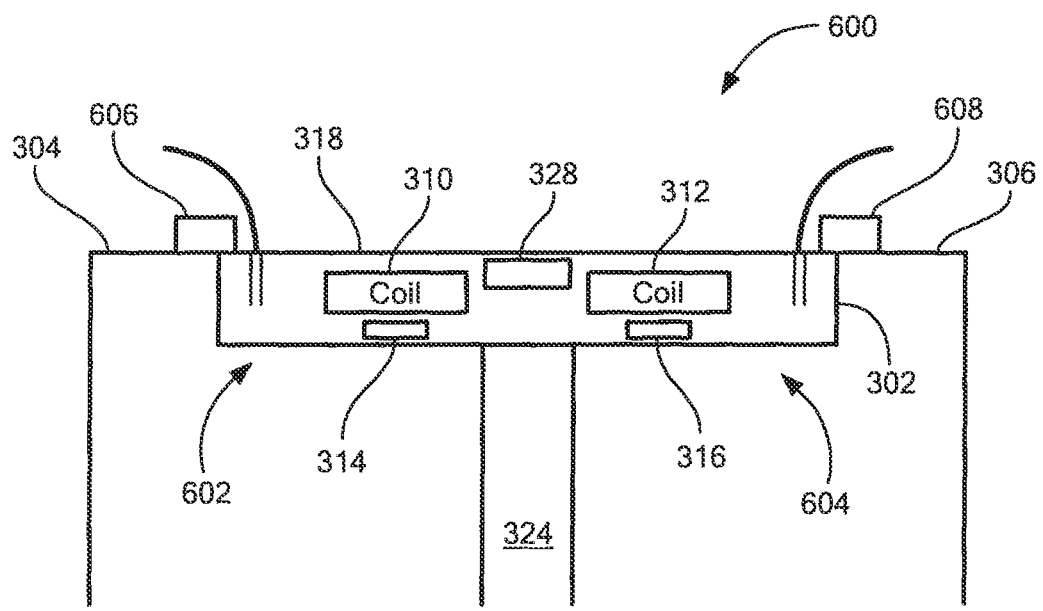
Figure 6B:
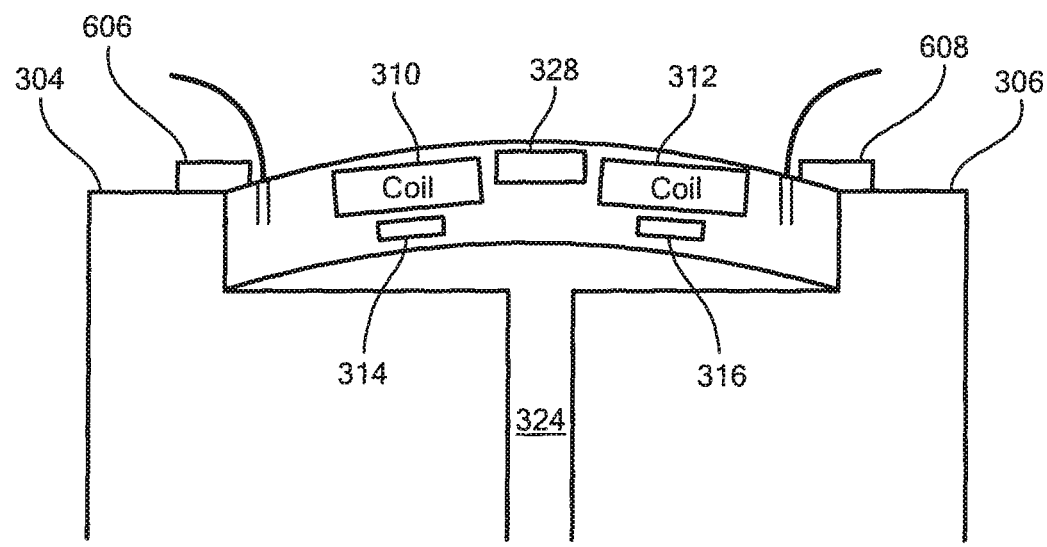

Referring to FIG. 6A and FIG. 6B, pressure sensor 600 may be similar to pressure sensor 300. However, targets 304 and 306 may include notches 602 and 604, respectively. Notches 602 and 604 may form a cavity within which substrate 302 may be placed. Clamps 606 and 608 may hold substrate 302 within notches 602 and 604 as the pressure in chamber 324 increases and decreases. In embodiments, notches 602 and 604 may have a depth that is substantially equal to the thickness of substrate 302 so that surface 318 of substrate 302 is substantially flush with the top surfaces of targets 304 and 306.

Because clamps 606 and 608 are placed at or around the edge of substrate 302, clamps 606 and 608 may still allow substrate 302 to deform and flex at its center in response to the changing pressure within chamber 324. For example, FIG. 6A shows substrate 302 in a non-deformed state and FIG. 6B shows substrate 302 in a deformed state due to greater pressure within chamber 324.

Clamps 606 and 608 may be formed from metal, ceramic, polymer, or any type of material that can hold substrate 302 within notches 602 and 604 while the fluid within chamber 324 is under pressure. In embodiments, clamps 606 and 608 are welded to targets 304 and 306 and/or substrate 302, adhered (e.g. by an adhesive) to targets 304 and 306 and/or substrate 302, screwed, bolted, or rivetted to targets 304 and 306 and/or substrate 302, or attached in any other way to secure substrate 302 into position within notches 304 and 306 and create a fluid-tight seal so that chamber 324 does not lose pressure.

Substrate 302 is shown in FIG. 6 in a flip-chip position. However, in other embodiments, substrate 302 may be replaced within pressure sensor 600 by a substrate in a die-up position, such as substrate 402.

In embodiments, targets 304 and 306 may form part of a pipe, hose, pneumatic fluid chamber, hydraulic fluid chamber, or the like. The fluid within chamber 324 may be fluid contained in the interior of the pipe, hose, or pneumatic or hydraulic chamber. As an example, in an automotive application the fluid within pressure chamber 324 may be brake fluid, power steering fluid, gasoline, air within a tire, gear oil, or any other fluid that is pumped or under pressure in a vehicle.

In the examples described, magnetic field sensing element 314 detects a distance to target 304 and magnetic field sensing element 316 detects a distance to target 306 in order to sense the pressure within chamber 324. However, in other embodiments, only one target and magnetic field sensing element may be needed. In this case, target 306 may be replaced with a non-conductive material that can act as a wall of chamber 324 and/or magnetic field sensing element 316 (and coil 312) can be removed or disabled. In this embodiment, only magnetic field sensing element 314 may operate to detect a distance to target 304.

Additional examples of pressure sensors that use eddy currents to detect proximity of a deflected substrate can be found in U.S. patent application Ser. No. 16/295,131 (filed Mar. 7, 2019) and U.S. patent application Ser. No. 15/606,362 (filed May 26, 2017), which are incorporated herein by reference in their entirety.

Having described various embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that the scope of the patent should not be limited to the described embodiments but rather should be limited only by the spirit and scope of the following claims. All references cited in this patent are incorporated by reference in their entirety.

The invention claimed is:

1. A pressure sensor comprising:
   a substrate;
   at least one coil supported by the substrate and responsive to a changing coil drive signal to produce a changing magnetic field;
   a fluid chamber having a first wall formed by the substrate and a second wall formed by a conductive material and positioned proximate to the at least one coil so that the changing magnetic field produces eddy currents within the conductive material that generate a reflected magnetic field; and at least one magnetic field sensing element configured to detect the reflected magnetic field and produce a signal responsive to a distance between the magnetic field sensing element and the second wall;

wherein the substrate is deformable by fluid pressure within the fluid chamber and the deformation of the substrate changes the distance between the magnetic field sensing element and the second wall.

2. The pressure sensor of claim 1 wherein the substrate is a semiconductor substrate.

3. The pressure sensor of claim 2 wherein the substrate comprises a through-silicon via.

4. The pressure sensor of claim 3 wherein the substrate is in a flip-chip position with the at least one magnetic field sensing element positioned between the at least one coil and the second wall.

5. The pressure sensor of claim 2 wherein the substrate is in a die-up position with the at least one coil positioned between the at least one magnetic field sensing element and the second wall.

6. The pressure sensor of claim 1 further comprising an adhesive to adhere the substrate to the second wall.

7. The pressure sensor of claim 6 wherein the adhesive comprises one or more of an anodic bond, a metal to glass seal, or an adhesive bond.

8. The pressure sensor of claim 7 wherein the adhesive is between the substrate and the second wall.

9. The pressure sensor of claim 8 wherein a thickness of the adhesive forms a gap between the substrate and the second wall.

10. The pressure sensor of claim 7 wherein the adhesive covers an edge of the substrate.

11. The pressure sensor of claim 1 wherein the fluid chamber comprises a third wall formed by a conductive material and positioned proximate to a second coil that produces a second changing magnetic field, wherein the second changing magnetic field produces second eddy currents within the conductive material of the third wall that generate a second reflected magnetic field.

12. The pressure sensor of claim 11 further comprising a second magnetic field sensing element configured to detect the second reflected magnetic field and produce a signal responsive to a distance between the second magnetic field sensing element and the third wall.

13. The pressure sensor of claim 1 further comprising at least one bond wire coupled to a via in the substrate.

14. The pressure sensor of claim 1 wherein the second wall comprises a notch and the substrate is positioned in the notch.

15. The pressure sensor of claim 1 further comprising a strain gauge supported by the substrate and configured to generate an output signal representing a strain on the substrate caused by the deformation of the substrate.

16. A system comprising:
a processor;
a pressure sensor electrically coupled to the processor and configured to generate a signal in response to a fluid pressure, the pressure sensor comprising:
a substrate;
at least one coil supported by the substrate and responsive to a changing coil drive signal to produce a changing magnetic field;

a fluid chamber having a first wall formed by the substrate and a second wall formed by a conductive material and positioned proximate to the at least one coil so that the changing magnetic field produces eddy currents within the conductive material that generate a reflected magnetic field; and at least one magnetic field sensing element configured to detect the reflected magnetic field and produce a signal responsive to a distance between the magnetic field sensing element and the second wall;

wherein the substrate is deformable by fluid pressure within the fluid chamber and the deformation of the substrate changes the distance between the magnetic field sensing element and the second wall.

17. The system of claim 16 wherein the substrate comprises a through-silicon via.

18. The system of claim 17 wherein the substrate is in a flip-chip position with the at least one magnetic field sensing element positioned between the at least one coil and the second wall.

19. The system of claim 16 wherein the substrate is in a die-up position with the at least one coil positioned between the at least one magnetic field sensing element and the second wall.

20. The system of claim 16 further comprising an adhesive to adhere the substrate to the second wall.

21. The system of claim 20 wherein the adhesive comprises one or more of an anodic bond, a metal to glass seal, or an adhesive bond.

22. The system of claim 20 wherein the adhesive is between the substrate and the second wall.

23. The system of claim 20 wherein the adhesive covers an edge of the substrate.

24. The system of claim 16 wherein the fluid chamber comprises a third wall formed by a conductive material and positioned proximate to a second coil that produces a second changing magnetic field, wherein the second changing magnetic field produces second eddy currents within the conductive material of the third wall that generate a second reflected magnetic field.

25. The system of claim 24 further comprising a second magnetic field sensing element configured to detect the second reflected magnetic field and produce a signal responsive to a distance between the second magnetic field sensing element and the third wall.

26. The system of claim 16 further comprising at least one bond wire coupled to the substrate.

27. A pressure sensor comprising:
a substrate that forms a first wall of a chamber;
a conductive target that forms a second wall of the chamber;
means for generating a reflected magnetic field from the conductive target;
means for generating a magnetic field signal in response to the reflected magnetic field;
means for detecting a distance between the substrate and the second wall of the chamber based on the magnetic field signal; and
means for changing the distance between the substrate and the conductive target in response to a change in pressure within the chamber.

\* \* \* \* \*

UNITED STATES PATENT AND TRADEMARK OFFICE
CERTIFICATE OF CORRECTION

| | |
|---|---|
| PATENT NO. | : 10,955,306 B2 |
| APPLICATION NO. | : 16/390355 |
| DATED | : March 23, 2021 |
| INVENTOR(S) | : Bryan Cadugan et al. |

It is certified that error appears in the above-identified patent and that said Letters Patent is hereby corrected as shown below:

In the Specification

Column 4, Line 21 delete "by substrate" and replace with --by a substrate--.

Column 5, Line 25 delete "Coil" and replace with --Coils--.

Column 5, Line 58 delete "coil" and replace with --coils--.

Column 6, Lines 12-13 delete "the symbol" and replace with --the '•' symbol--.

Column 8, Line 15 delete "field" and replace with --fields--.

Column 8, Line 20 delete "field" and replace with --fields--.

Column 8, Line 60 delete "target" and replace with --targets--.

Column 9, Line 19 delete "magnet" and replace with --magnetic--.

Column 10, Line 24 delete ", or pneumatic or" and replace with --, pneumatic or--.

Signed and Sealed this
Twenty-sixth Day of April, 2022

Katherine Kelly Vidal
*Director of the United States Patent and Trademark Office*